US012666699B2

(12) United States Patent
Pfirsch

(10) Patent No.: US 12,666,699 B2
(45) Date of Patent: Jun. 23, 2026

(54) RC IGBT AND METHOD OF PRODUCING AN RC IGBT

(71) Applicant: Infineon Technologies AG, Neubiberg (DE)

(72) Inventor: Frank Dieter Pfirsch, Munich (DE)

(73) Assignee: Infineon Technologies AG, Neubiberg (DE)

( * ) Notice: Subject to any disclaimer, the term of this patent is extended or adjusted under 35 U.S.C. 154(b) by 782 days.

(21) Appl. No.: 17/831,597

(22) Filed: Jun. 3, 2022

(65) Prior Publication Data

US 2022/0392892 A1     Dec. 8, 2022

(30) Foreign Application Priority Data

Jun. 4, 2021    (DE) .......................... 102021114434.5

(51) Int. Cl.
| | |
|---|---|
| *H10D 84/60* | (2025.01) |
| *H10D 8/00* | (2025.01) |
| *H10D 8/01* | (2025.01) |
| *H10D 12/00* | (2025.01) |
| *H10D 12/01* | (2025.01) |
| *H10D 84/00* | (2025.01) |

(52) U.S. Cl.
CPC ........... *H10D 84/617* (2025.01); *H10D 8/045* (2025.01); *H10D 8/422* (2025.01); *H10D 12/038* (2025.01); *H10D 12/481* (2025.01); *H10D 84/143* (2025.01); *H10D 84/161* (2025.01)

(58) Field of Classification Search
CPC .. H10D 12/461; H10D 12/481; H10D 12/032; H10D 12/035; H10D 12/038; H10D 12/491; H10D 84/811
See application file for complete search history.

(56) References Cited

U.S. PATENT DOCUMENTS

| | | | |
|---|---|---|---|
| 2009/0189181 A1* | 7/2009 | Koyama | ............. H01L 29/7397 |
| | | | 257/E29.197 |
| 2017/0018547 A1* | 1/2017 | Naito | ................... H10D 84/811 |

FOREIGN PATENT DOCUMENTS

| | | |
|---|---|---|
| DE | 102004040997 A1 | 3/2005 |
| DE | 102009049051 A1 | 4/2010 |
| DE | 102015118322 A1 | 4/2017 |

* cited by examiner

*Primary Examiner* — Jesse Y Miyoshi
(74) *Attorney, Agent, or Firm* — Murphy, Bilak & Homiller, PLLC

(57) ABSTRACT

An RC IGBT includes: an active region with separate IGBT and diode sections; a semiconductor body forming a part of the active region; a first load terminal and control terminal at a first side of the body and a second load terminal at a second side, the control terminal including a control terminal finger that laterally overlaps, in the active region, with the diode section. Control trenches extending into the semiconductor body along a vertical direction have a control trench electrode electrically connected to the control terminal for controlling a load current between the load terminals in the IGBT section. At least one control trench extends into both IGBT and diode sections. The electrical connection between the control trench electrode of that control trench and the control terminal is established at least based on an electrically conductive member arranged, in the diode section, in contact with the control terminal finger.

20 Claims, 18 Drawing Sheets

(1)

(2)

(3)

(2)

RC IGBT AND METHOD OF PRODUCING AN RC IGBT

TECHNICAL FIELD

This specification refers to embodiments of an RC IGBT and to embodiments of a method of producing an RC IGBT.

BACKGROUND

Many functions of modern devices in automotive, consumer and industrial applications, such as converting electrical energy and driving an electric motor or an electric machine, rely on power semiconductor switches. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor body configured to conduct a forward load current along a load current path between two load terminals of the device.

Further, in case of a controllable power semiconductor device, e.g., a transistor, the load current path may be controlled by means of an insulated electrode, commonly referred to as gate electrode. For example, upon receiving a corresponding control signal from, e.g., a driver unit, the control trench electrode may set the power semiconductor device in one of a forward conducting state and a blocking state. In some cases, the gate electrode may be included within a trench of the power semiconductor switch, wherein the trench may exhibit, e.g., a stripe configuration or a needle configuration.

Some power semiconductor devices further provide for a reverse conductivity; during a reverse conducting state, the power semiconductor device conducts a reverse load current. Such devices may be designed such that the forward load current capability (in terms of magnitude) is substantially the same as the reverse load current capability.

A typical device that provides for both forward and reverse load current capability is the reverse conducting (RC) IGBT. Typically, for an RC IGBT, the forward conducting state is controllable, e.g., by providing a corresponding signal to the gate electrodes, and the reverse conducting state is typically not controllable, but, due to one or more diode structures in the RC IGBT, the RC IGBT assumes the reverse conducting state automatically if a reverse voltage is present at the load terminals.

It is, of course, possible to provide a reverse current capability by means of a separate diode; e.g., a diode connected anti-parallel to a regular (not reverse conducting) IGBT.

The embodiments described herein, however, relate to the variant where both the IGBT structure and the diode structures are monolithically integrated within the same chip.

A typical design goal for an RC IGBT is an effective use of the active area, i.e., the area of the RC IGBT that is used for both forward and reverse load current conduction.

SUMMARY

According to an embodiment, an RC IGBT comprises: an active region with an IGBT section and, separate from the IGBT section, a diode section; a semiconductor body forming a part of the active region and having a first side and a second side; a first load terminal at the first side and a second load terminal at the second side; a control terminal at the first side, wherein the control terminal is electrically insulated from the semiconductor body and comprises a control terminal finger that laterally overlaps, in the active region, with the diode section. The RC IGBT further comprises a plurality of control trenches extending into the semiconductor body along a vertical direction. Each control trench has a control trench electrode electrically connected to the control terminal and configured to control a load current between the first load terminal and the second load terminal in the IGBT section. At least one of the plurality of control trenches extends into both the IGBT section and the diode section. The electrical connection between the control trench electrode of said at least one control trench and the control terminal is established at least based on an electrically conductive member arranged, in the diode section, in contact with the control terminal finger.

According to another embodiment, a method of producing an RC IGBT comprises forming the following the components: an active region with an IGBT section and, separate from the IGBT section, a diode section; a semiconductor body forming a part of the active region and having a first side and a second side; a first load terminal at the first side and a second load terminal at the second side; a control terminal at the first side, wherein the control terminal is electrically insulated from the semiconductor body and comprises a control terminal finger that laterally overlaps, in the active region, with the diode section. The RC IGBT production method further comprises forming a plurality of control trenches extending into the semiconductor body along a vertical direction. Each control trench has a control trench electrode electrically connected to the control terminal and configured to control a load current between the first load terminal and the second load terminal in the IGBT section. At least one of the plurality of control trenches extends into both the IGBT section and the diode section. The electrical connection between the control trench electrode of said at least one control trench and the control terminal is established at least based on an electrically conductive member arranged, in the diode section, in contact with the control terminal finger.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis is being placed upon illustrating principles of the invention. Moreover, in the figures, like reference numerals designate corresponding parts. In the drawings.

DETAILED DESCRIPTION

Figures 1, 2:
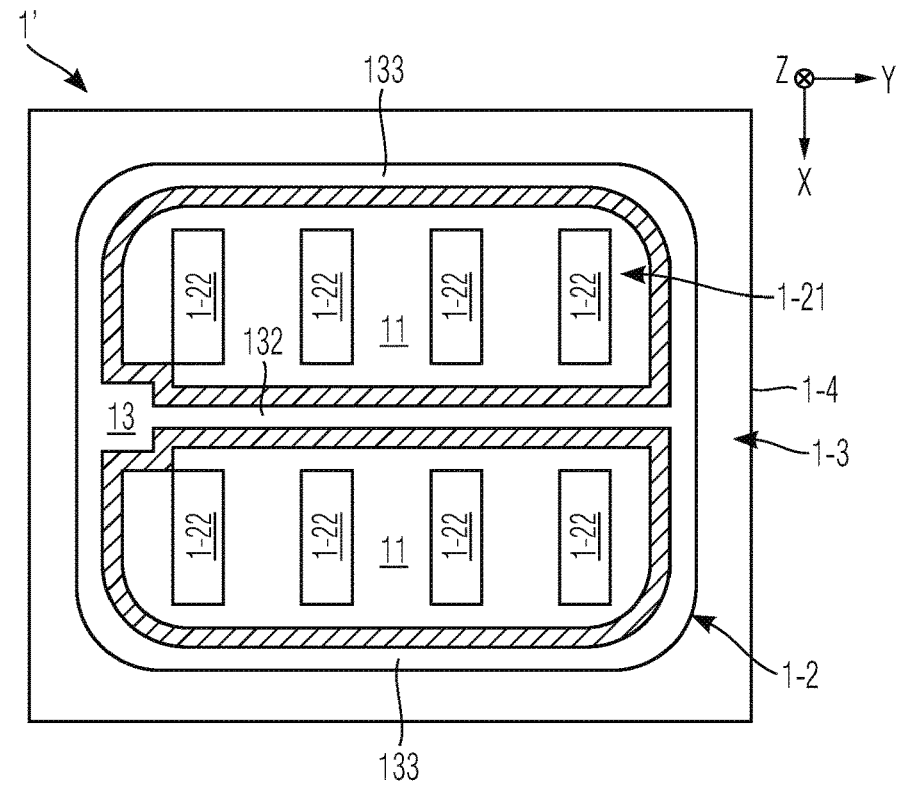
FIG. 1 schematically and exemplarily illustrates a section of a horizontal projection of an exemplary RC IGBT.
FIG. 2 schematically and exemplarily illustrates a section of a horizontal projection of an exemplary RC IGBT.

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die or a chip. For example, both the first lateral direction X and the second lateral direction Y mentioned herein can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer/chip/die. For example, the vertical direction Z mentioned herein may be an extension direction that is perpendicular to both the first lateral direction X and the second lateral direction Y.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other does not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to an RC IGBT exhibiting a stripe or needle cell configuration, e.g., an RC IGBT to be used within a power converter or a power supply. Thus, in an embodiment, such RC IGBT can be configured to carry a load current that is to be fed to a load and/or, respectively, that is provided by a power source. For example, the RC IGBT may comprise a plurality of power semiconductor cells, such as monolithically integrated diode cells, derivatives of a monolithically integrated diode cell, monolithically integrated IGBT cells and/or derivatives thereof. Such diode/transistor cells may be integrated in a power semiconductor module. A plurality of such cells may constitute a cell field that is arranged within an active region of the RC IGBT.

The term "RC IGBT" as used in this specification intends to describe a power semiconductor device on a single chip with high voltage blocking and/or high current-carrying capabilities. In other words, embodiments of the RC IGBT described herein are single chip power semiconductor devices configured for high current, typically in the Ampere range, e.g., up to several Ampere or up to several ten or hundred Ampere, and/or high voltages, typically 200 V and above, e.g., up to at least 400 V or even more, e.g., up to at least 3 kV, or even up to 10 kV or more.

For example, the RC IGBT described below may be a single chip power semiconductor device exhibiting a stripe cell configuration and configured to be employed as a power component in a low-, medium- and/or high voltage application. Several single chip power RC IGBTs may be integrated in a module so as to form an RC IGBT module, e.g., for installation and use in a low-, medium- and/or high voltage application, such as a major home appliance, a general purpose drive, an electric-drive train, a servo drive, a traction, a (higher) power transmission facility, etc.

For example, the term "RC IGBT" as used in this specification is not directed to a logic semiconductor device used for, e.g., storing data, computing data and/or other types of semiconductor based data processing.

FIG. 1 and FIG. 2 both schematically and exemplarily illustrate, in a simplified manner, a horizontal projection of a respective RC IGBT 1' in accordance with two examples. The RC IGBT 1' can in each case be a single chip RC IGBT. Several of such single chip RC IGBTs may be integrated in a power semiconductor module.

The RC IGBT 1' comprises an active region 1-2 with one or more diode sections 1-22 and one or more IGBT sections 1-21. Both the one or more diode sections 1-22 and the one or more IGBT sections 1-21 are integrated within the same chip of the RC IGBT 1'.

An edge termination region 1-3 surrounds the active region 1-2. The edge termination region 1-3 is arranged external of the active region 1-2. The edge termination region 1-3 is laterally terminated by an edge 1-4. The edge 1-4 may form the chip edge of the power semiconductor device 1, e.g., originating from a dicing/sawing processing step.

In an embodiment, the vertical projection of a lateral circumference of the active region 1-2 defines the boundary between the active region 1-2 and the edge termination region 1-3.

As used herein, the terms "edge termination region" and "active region" have the respective technical meaning the skilled person typically associates therewith in the context of power semiconductor devices, such as RC IGBTs. That is, the active region 1-2 is primarily configured for forward load current (i.e., "IGBT load current") and reverse load current (i.e., "diode load current") conduction and switching purposes, whereas the edge termination region 1-3 primarily fulfills functions regarding reliable blocking capabilities, appropriate guidance of the electric field, sometimes also charge carrier drainage functions, and/or further functions regarding protection and proper termination of the active region 1-2.

The present specification relates to the configuration of the active region 1-2.

As will be elucidated in more detail below, the RC IGBT 1', or, respectively, RC IGBT 1 (cf. FIG. 3) can comprise, in the active region 1-2, the IGBT section(s) 1-21 and the diode section(s) 1-22. The different sections 1-21 and 1-22 may be laterally distributed within the active region 1-2, examples of such distribution being described in pending German Patent Applications DE 10 2019 125 007.2 and DE 10 2020 107 277.5.

In an embodiment, the active region 1-2 consists of the diode section(s) 1-22 and the IGBT section(s) 1-21.

In accordance with one or more embodiments described herein, none of the diode sections 1-22 is integrated into the IGBT section 1-21; in other words, in such embodiments, the diode sections 1-22 and the IGBT section 1-21 section are not intermixed with each other. For example, in an embodiment, none of one or more diode sections 1-22 comprises any semiconductor source region (reference numeral 101) of the first conductivity type that is electrically connected to the first load terminal (reference numeral 11) and arranged adjacent to a respective one of the control trenches (reference numeral 14).

For example, the one or more diode sections 1-22 (which are for example not integrated into/intermixed with the IGBT section 1-21 and which are not electrically connected to the first load terminal 11 via source regions 101 of the first conductivity type in an embodiment) form a significant portion of the active region 1-2. Hence, each of the one or more diode sections 1-22 mentioned herein may be a "larger-diode-only" portion of the active region 1-2, in accordance with an embodiment. For example, at least ⅕ or at least ¼ or at least ⅓ of the active region 1-2 may be occupied by the diode section(s) 1-22, and the rest of the active region 1-2 may be occupied by the IGBT section(s) 1-21.

Irrespective of the chosen spatial distribution of the IGBT section 1-21 and diode sections 1-22 within the active region 1-2, it may be ensured that, with respect to a volume of the active region 1-2, the ratio between the total of the IGBT section 1-21 and the total of the diode sections 1-22 is at least 1.5:1, or respectively, at least 2:1, i.e., larger or equal than 2:1. The chosen ratio may depend on the application in which the power semiconductor device 1 is employed. For example, irrespective of the chosen spatial distribution of the IGBT sections 1-21 and diode sections 1-22, it may be ensured that, with respect to a volume of the active region 1-2, the ratio between the IGBT section(s) 1-21 and the diode section(s) 1-22 is even larger than 3:1 or larger than 5:1.

In an embodiment, at least 75% of the total volume of the active region 1-2 may be occupied for forming the IGBT section(s) 1-21, and the remaining 25% (or a lower percentage share) of the active region 1-2 may be employed for forming the diode section(s) 1-22.

Furthermore, there may be one or more transition regions (not-illustrated) arranged between a respective one of the diode section(s) 1-22 and a respective one of the IGBT section(s) 1-21. Each of the one or more transition regions is for example not equipped with a semiconductor source region and exhibits a comparatively low anode emitter efficiency as compared to respective portion thereof in the diode section(s) 1-22), in accordance with an embodiment.

If the one or more transition regions is/are provided, the portion occupied thereby is smaller than 20%, smaller than 10% or even smaller than 5% of the total horizontal area of the active region 1-2, in accordance with an embodiment.

In an embodiment, the total horizontal area of the one or more diode sections 1-22 forms a portion of 5% to 40%, or a portion of 15% to 35% of the total horizontal area of both the diode sections 1-22 and the IGBT section 1-21. Said horizontal areas may be determined at a first side 110 of a semiconductor body 10, which may be a frontside.

Furthermore, each of the one or more diode sections 1-22 may have a horizontal area and a circumference defining the horizontal area, wherein each diode section 1-22 obeys the relation that the square of the circumference divided by the area is smaller or equal to 40 or smaller or equal to 30.

In the following, reference will be also be made to "the" diode section 1-22 and "the" IGBT section 1-21. It shall be understood that the explanation provided below with respect to these sections 1-21 and 1-22 may apply to each IGBT section 1-21 or, respectively, each diode section 1-22 that are provided in the active region 1-2. For example, if more than one IGBT section 1-21 is provided, each IGBT section 1-21 may be equally configured (wherein, for example, the IGBT sections 1-21 may differ from each other in total lateral extension or exhibit identical total lateral extensions). Accordingly, if a plurality of diode sections 1-22 is provided, each diode section 1-22 may be equally configured (wherein, for example, the diode sections 1-22 may differ from each other in total lateral extension or exhibit identical total lateral extensions).

As illustrated in both FIGS. 1 and 2, the respective RC IGBT 1' has a first load terminal 11 at its front side and, separate (cf. cross-hatched areas in FIGS. 1 and 2 indicating gaps that may or may not be filled with an insulating material) therefrom, a control terminal 13. The first load terminal may be the emitter terminal of the RC IGBT 1' and hence be configured for both forward and reverse load current conduction. By contrast, the control terminal 13 may be the gate terminal of the RC IGBT' and configured for controlling at least the forward load current based on a control signal. In the examples, the control terminal 13 is also arranged at the front side. The control terminal 13 comprises a control terminal runner 133 arranged substantially in accordance with the lateral circumference of the active region 1-2 and control terminal fingers extending into the active region 1-2.

In accordance with FIGS. 1 and 2, the control terminal 13 is electrically connected with control trench electrodes arranged in control trenches (not illustrated in FIGS. 1 and 2) that may be arranged in parallel to the illustrated stripe configuration of the diode sections 1-22, e.g., by extending from a section of the control terminal runner 133 to a section of the control terminal finger 132 along the first lateral direction X. But, the control trenches typically do not extend into the diode sections 1-22. That is, the electrical connection between the control trench electrodes and the control terminal 13 is established external of the diode sections 1-22.

Accordingly, the control terminal fingers 132 extend into the active region 1-2 and there do not laterally overlap with the diode sections 1-22.

Typically, effective usage of the active region 1-2 is not possible in portions of the active region 1-2 corresponding to vertical projections of the control terminal fingers 132. Below the control terminal fingers 132, there is typically no vertically extending electrical conductor between first load terminal 11 and the semiconductor body.

Figure 3:
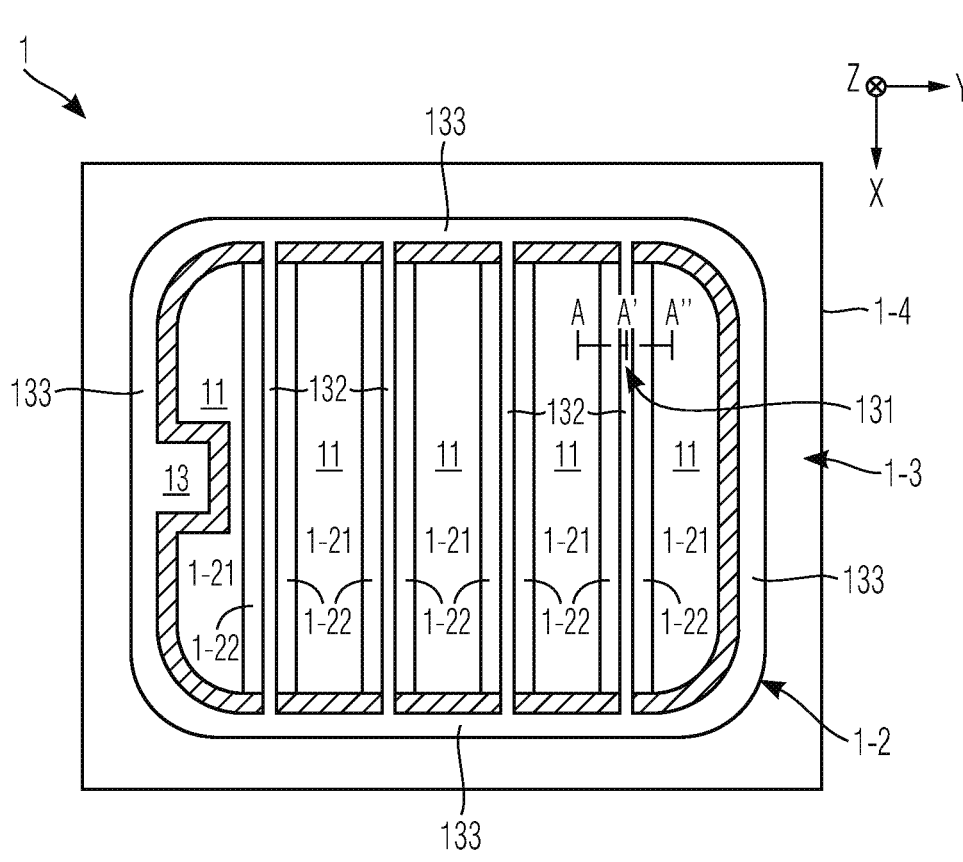
FIG. 3 schematically and exemplarily illustrates a section of a horizontal projection of an exemplary RC IGBT in accordance with one or more embodiments.

FIG. 3 schematically and exemplarily illustrates a section of a horizontal projection of an exemplary RC IGBT 1 in accordance with one or more embodiments. There, the design of the electrical connection between the control terminal 13 and the control trench electrodes of the control trenches (being described in more detail further below) within the active region 1-2 is altered as compared to the exemplary RC IGBTs 1' illustrated in FIGS. 1 and 2. Otherwise, everything what has been described above may equally apply to the embodiments that will now be described below, in particular with respect to FIGS. 3 to 18.

In the following, it will also be referred to

Figure 4:
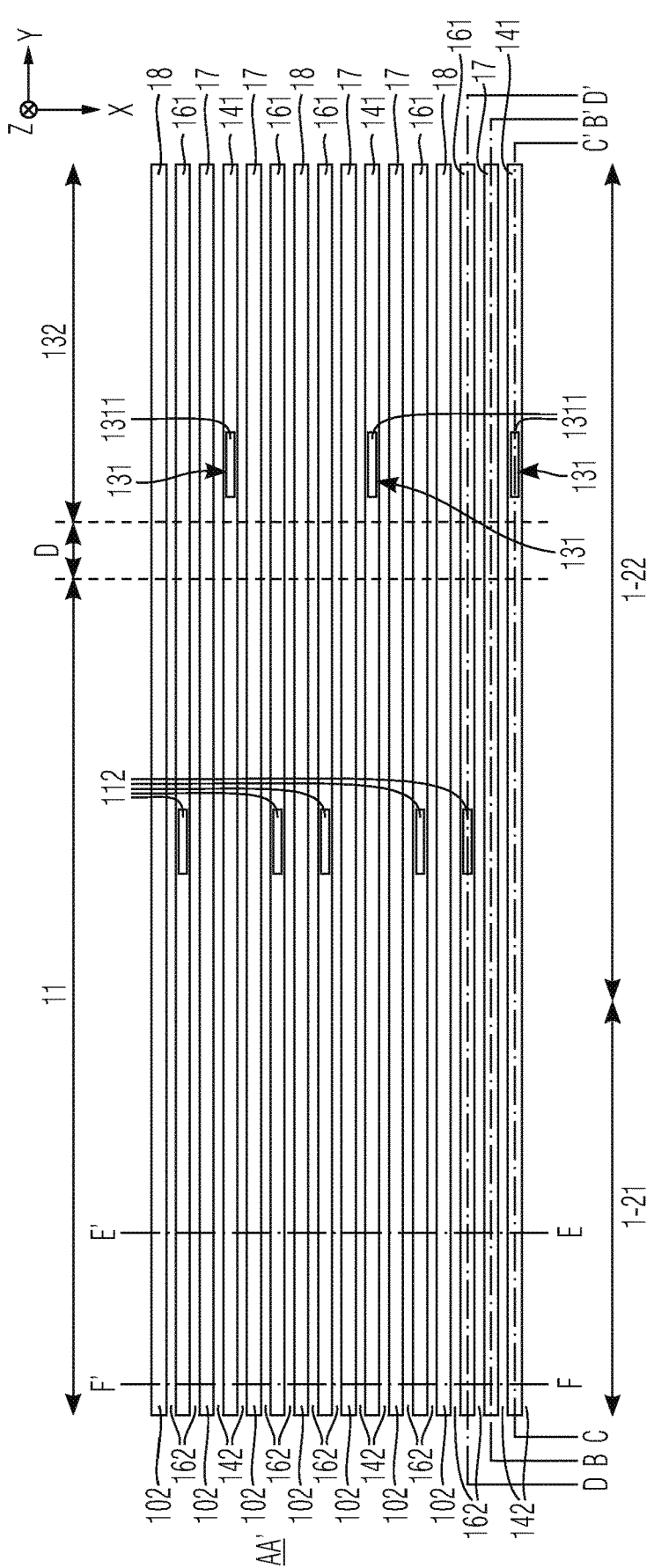
FIG. 4 schematically and exemplarily illustrates a section AA' of the horizontal projection of the exemplary RC IGBT illustrated by FIG. 3 in more detail in accordance with one or more embodiments.
Figure 5:
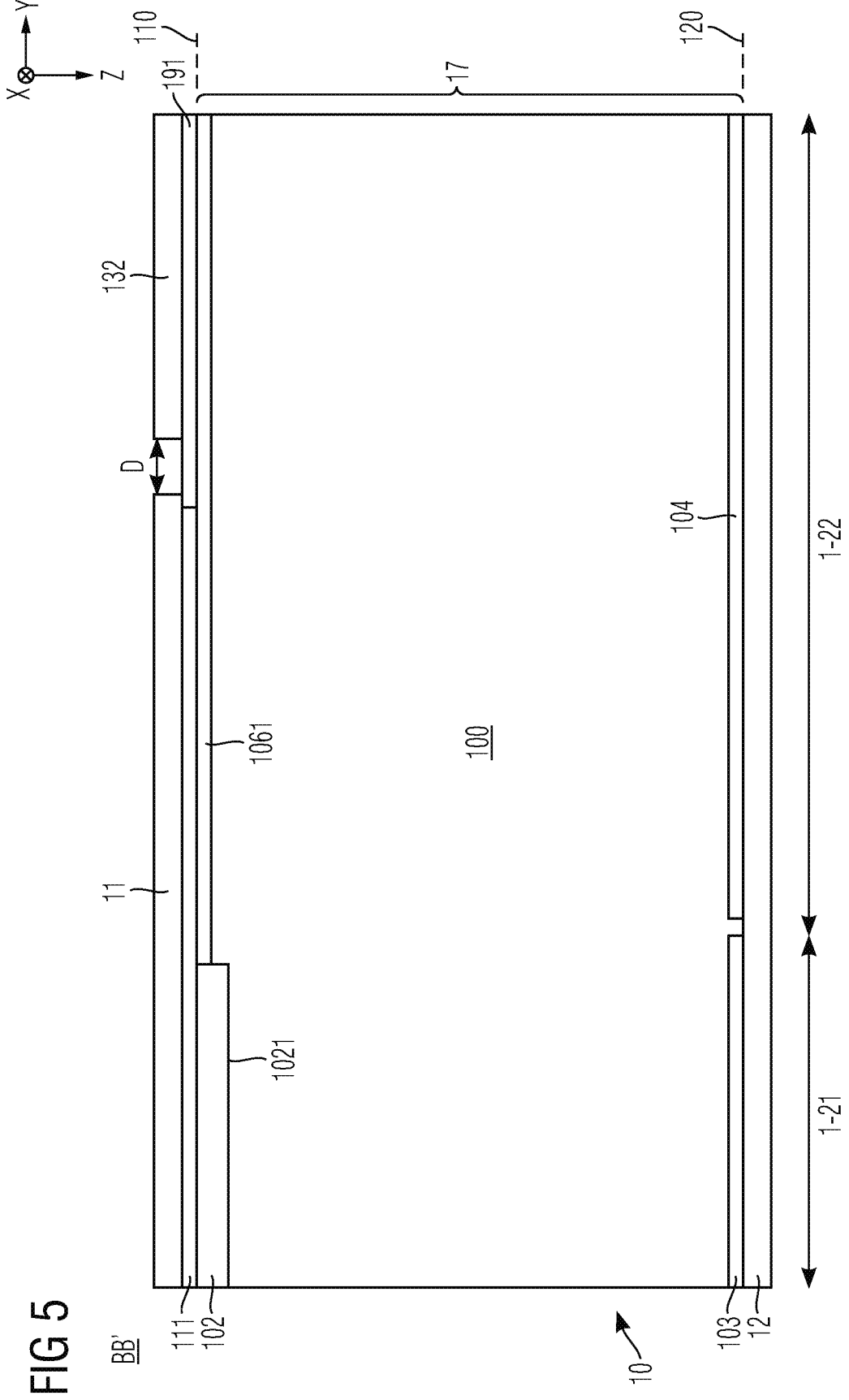
FIG. 5 schematically and exemplarily illustrates a section of a vertical cross-section BB' of the RC IGBT illustrated in FIG. 4 in accordance with one or more embodiments.
Figure 6:
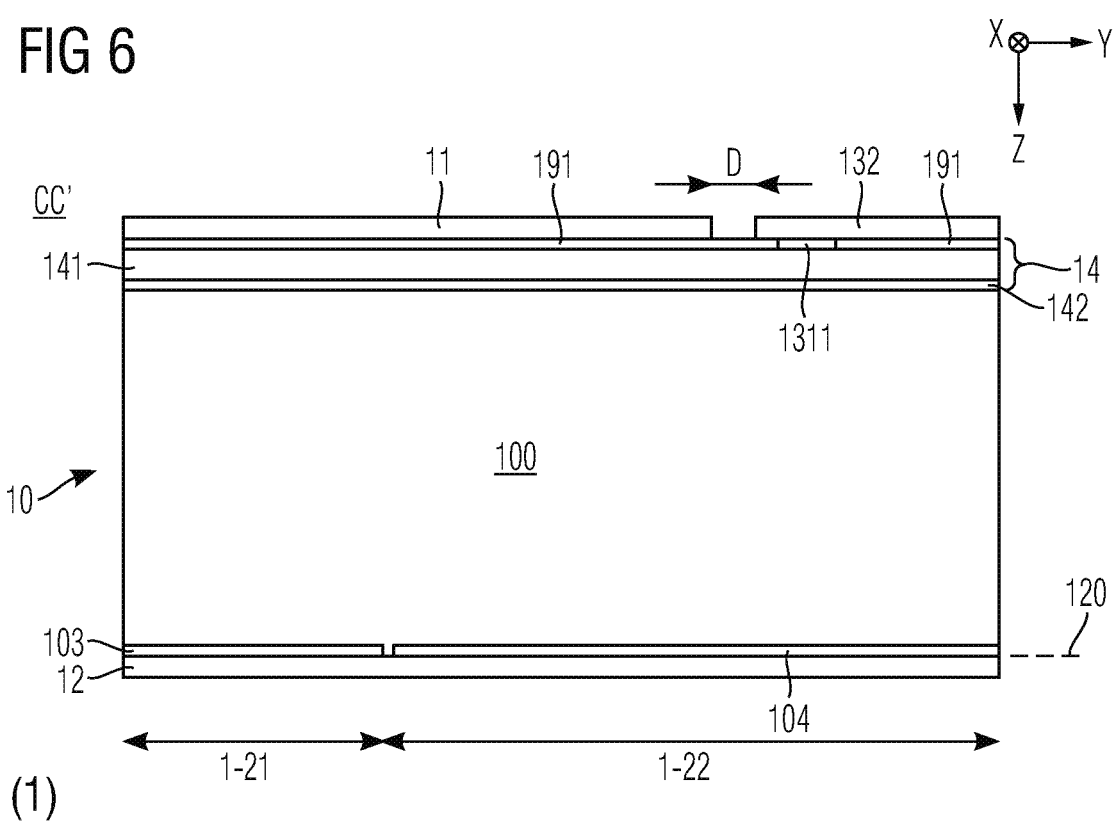
FIG. 6 schematically and exemplarily illustrates three variants of a section of a vertical cross-section CC' of the RC IGBT illustrated in FIG. 4 in accordance with one or more embodiments.
Figure 6:
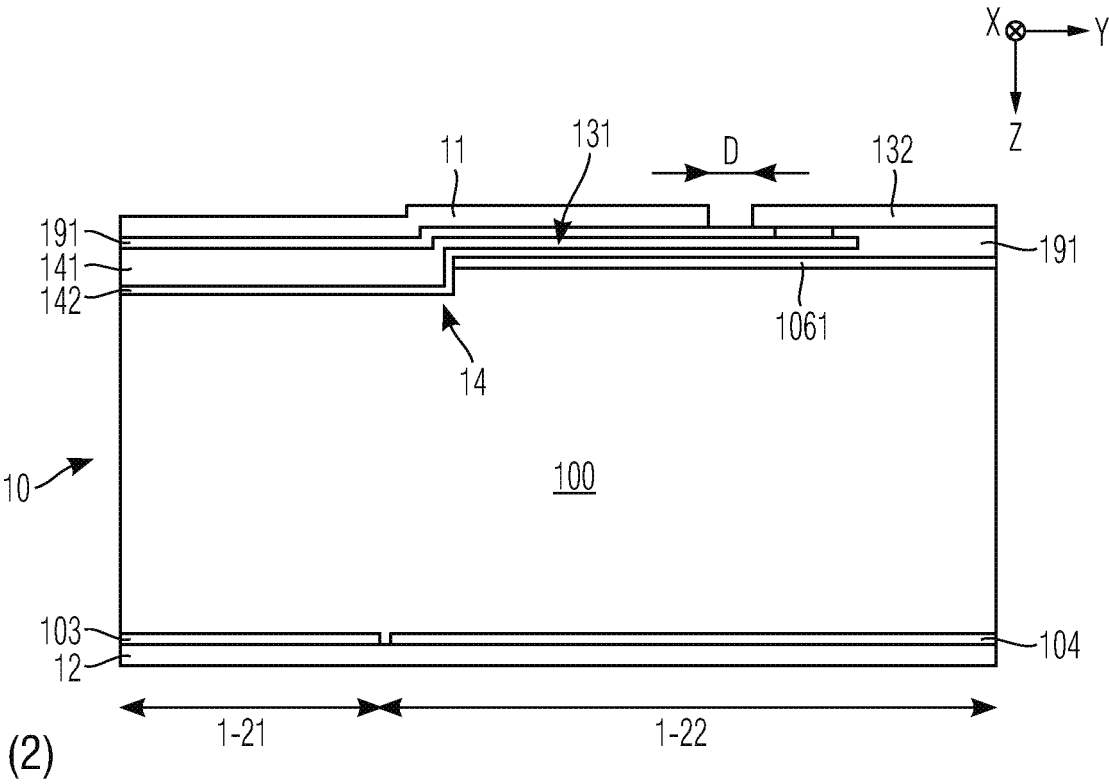
Figure 6:
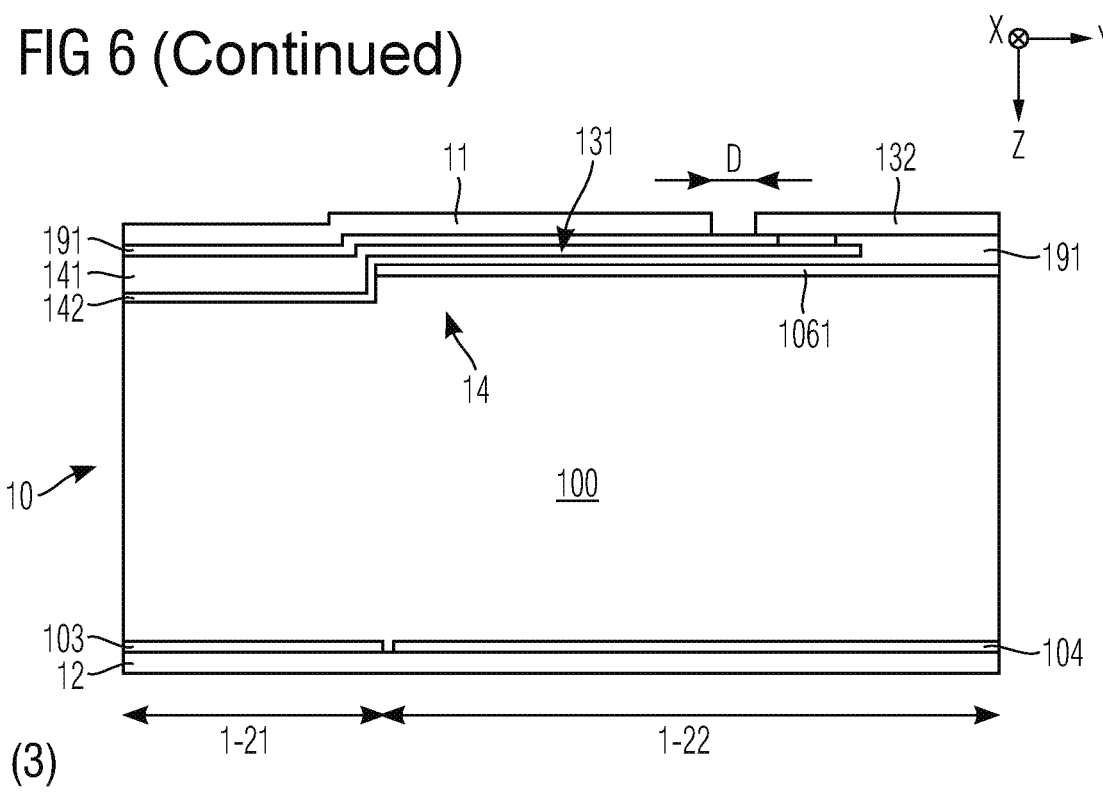
Figure 7:
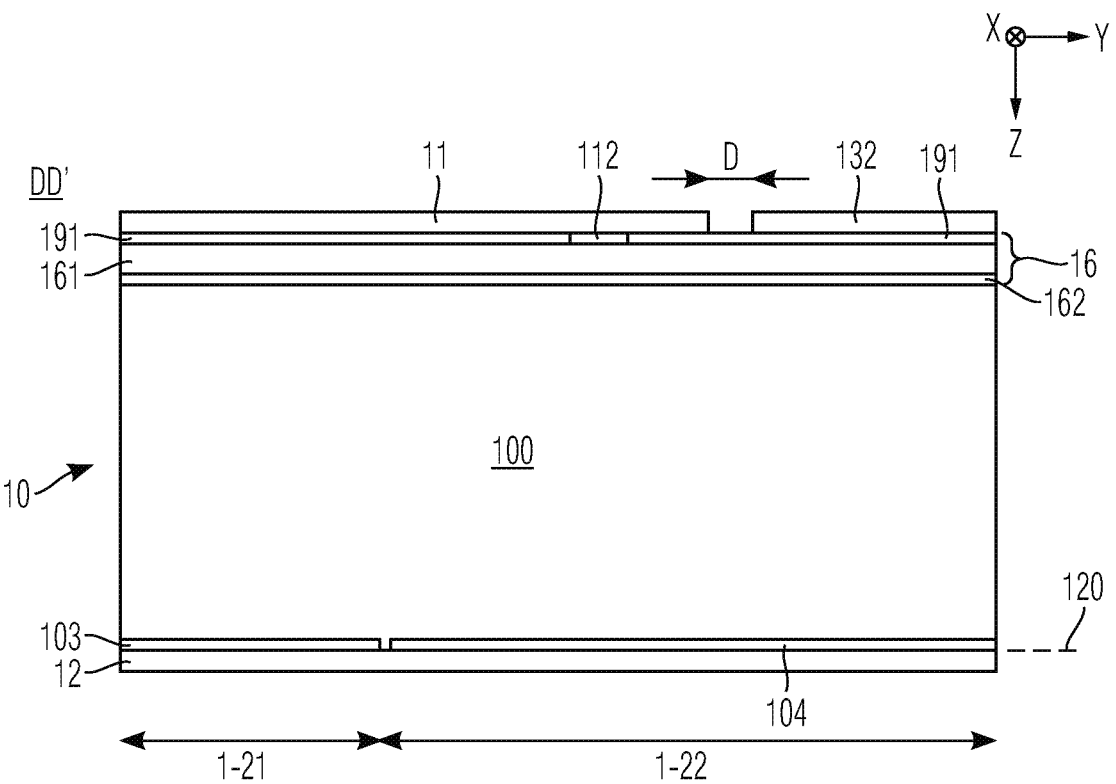
FIG. 7 schematically and exemplarily illustrates a section of a vertical cross-section DD' of the RC IGBT illustrated in FIG. 4 in accordance with one or more embodiments.
Figure 8:
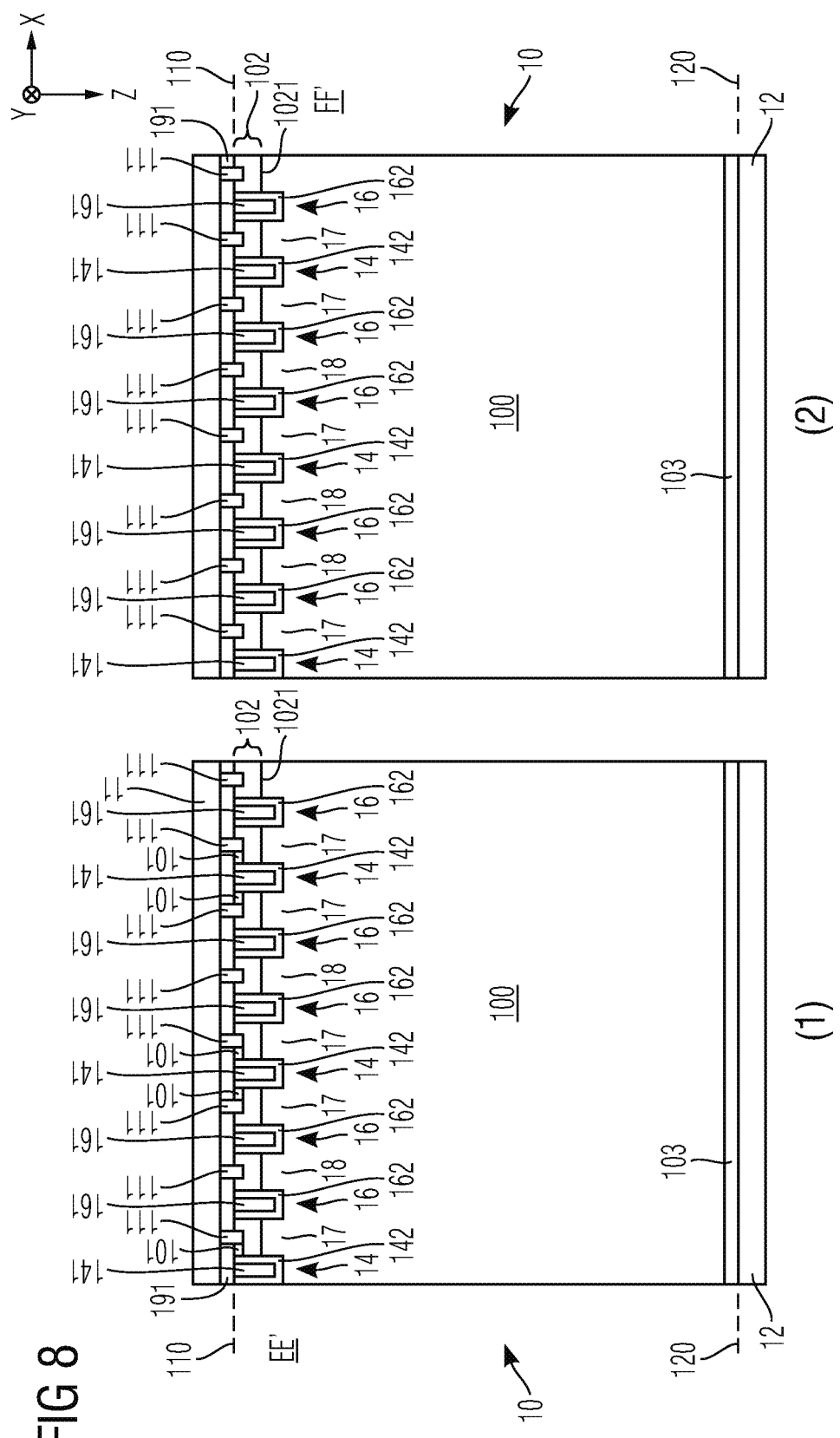
FIG. 8 schematically and exemplarily illustrates sections of vertical cross-sections EE' and FF', respectively, of the RC IGBT illustrated in FIG. 4 in accordance with one or more embodiments.
Figure 9:
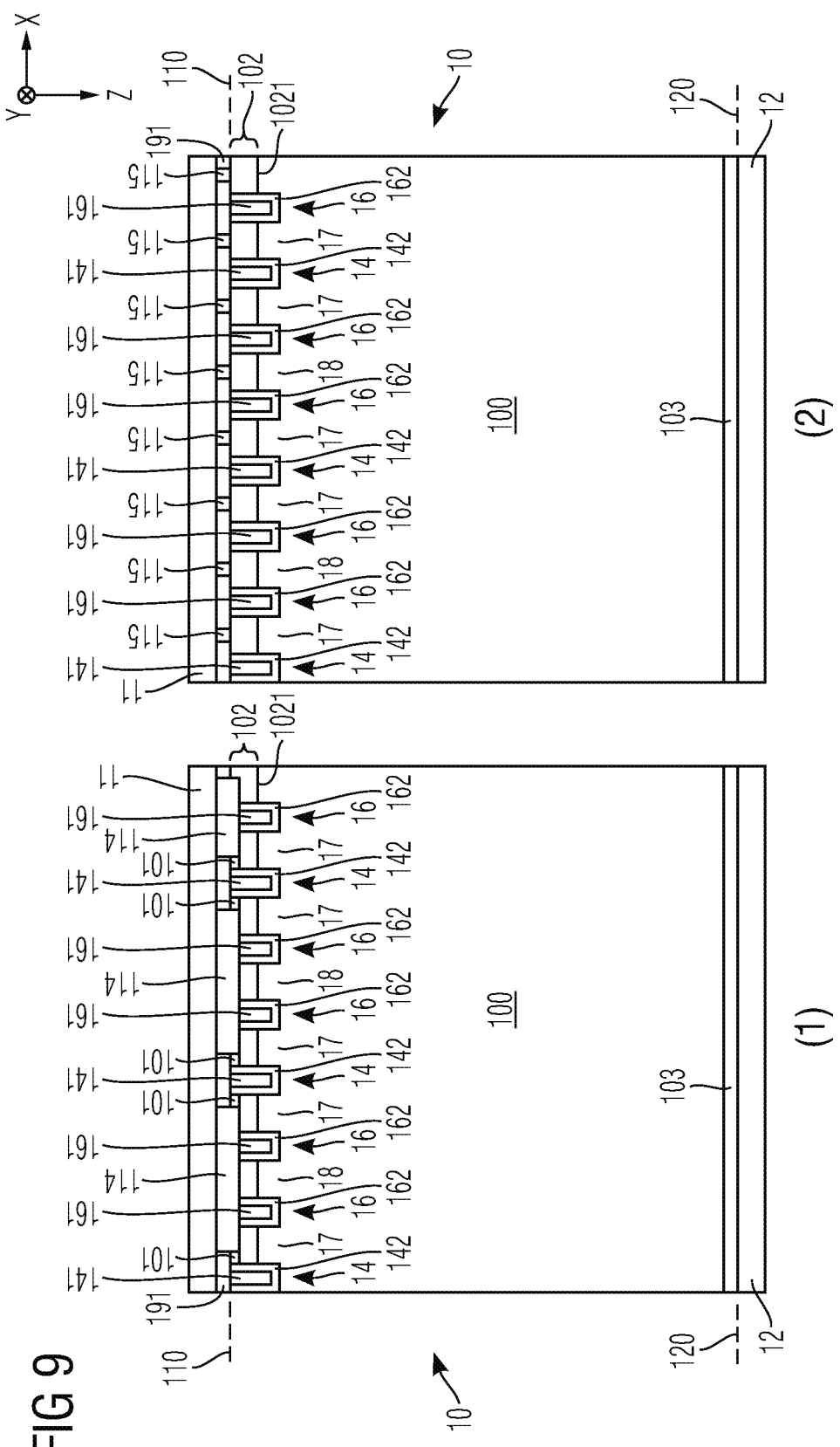
FIG. 9 schematically and exemplarily illustrates sections of vertical cross-sections of a variation of the RC IGBT illustrated in FIG. 4 in accordance with one or more embodiments.
Figure 10:
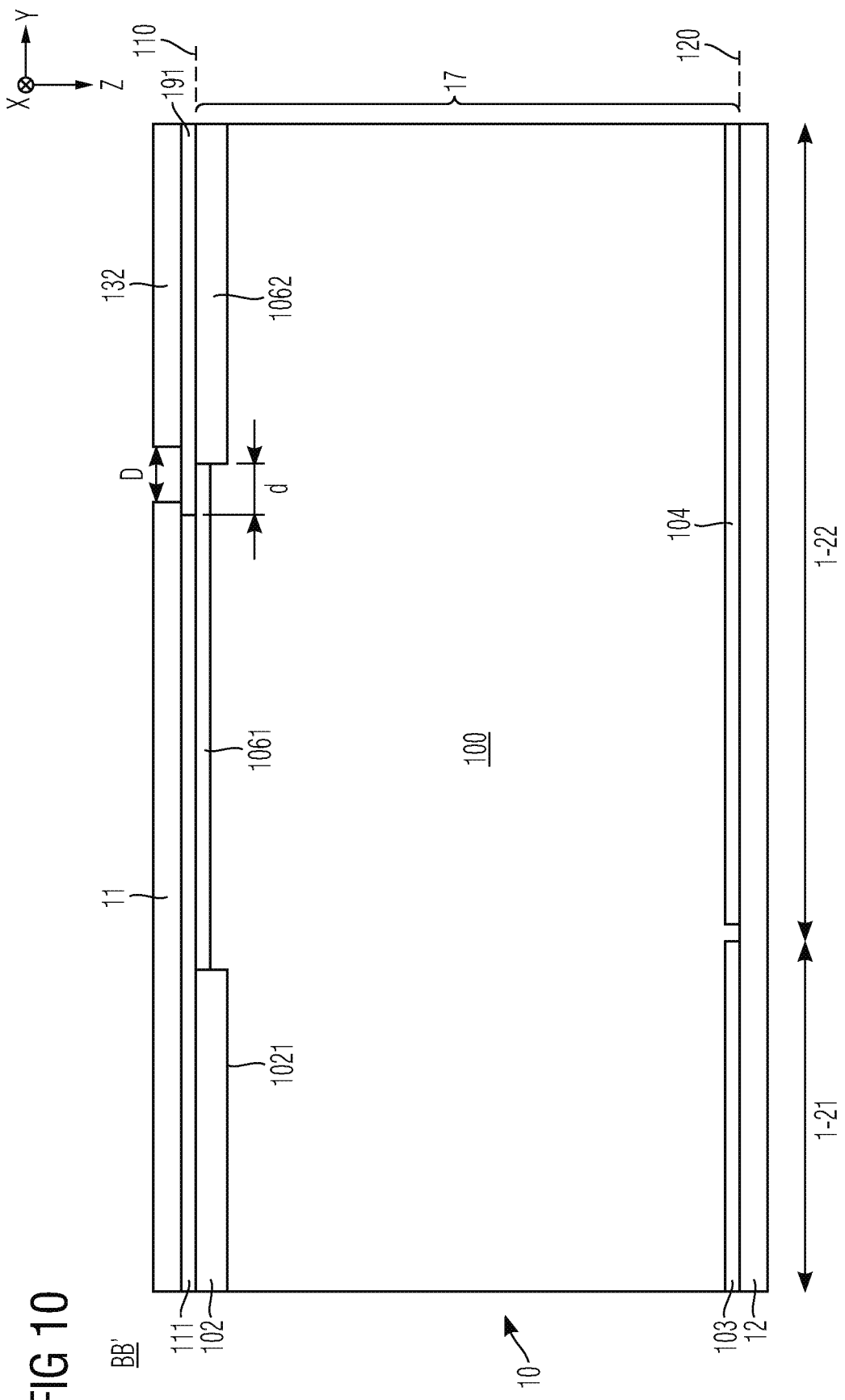
FIG. 10 schematically and exemplarily illustrates a section of a vertical cross-section BB' of the RC IGBT illustrated in FIG. 4 in accordance with one or more embodiments.
Figure 11:
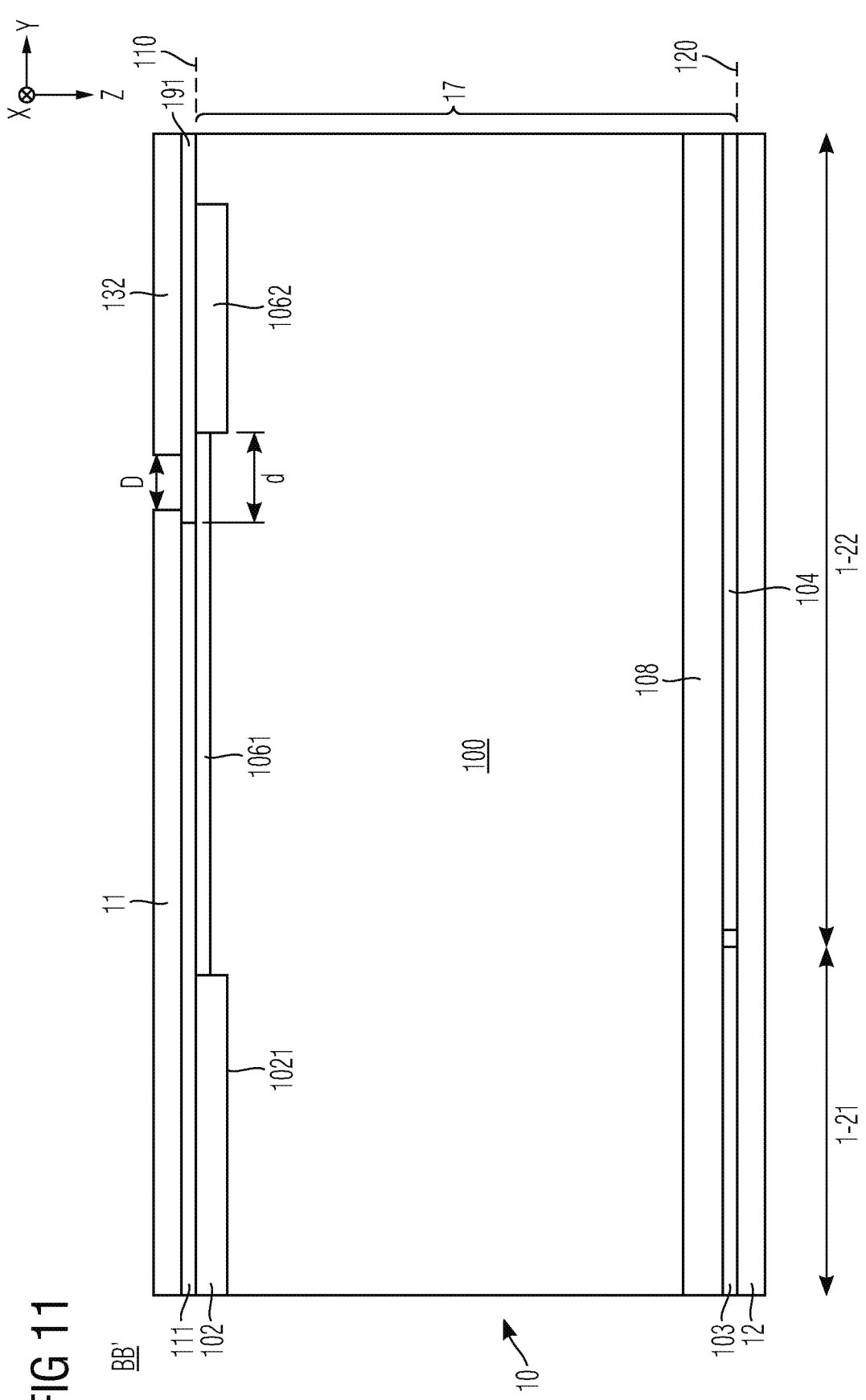
FIG. 11 schematically and exemplarily illustrates a variant of the configuration illustrated in FIG. 10 in accordance with one or more embodiments.
Figure 12:
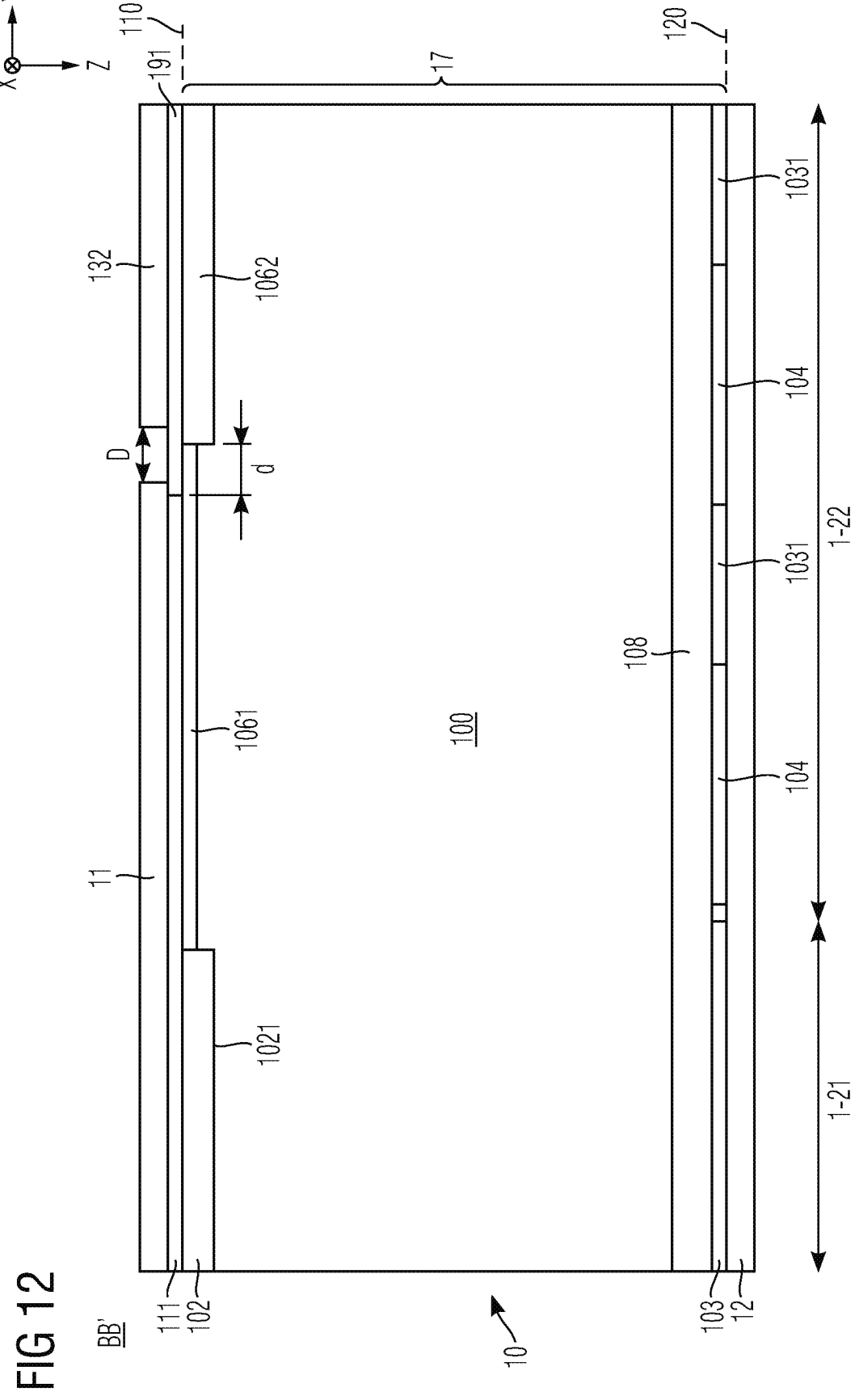
FIG. 12 schematically and exemplarily illustrates a further variant of the configuration illustrated in FIG. 10 in accordance with one or more embodiments.
Figure 16:
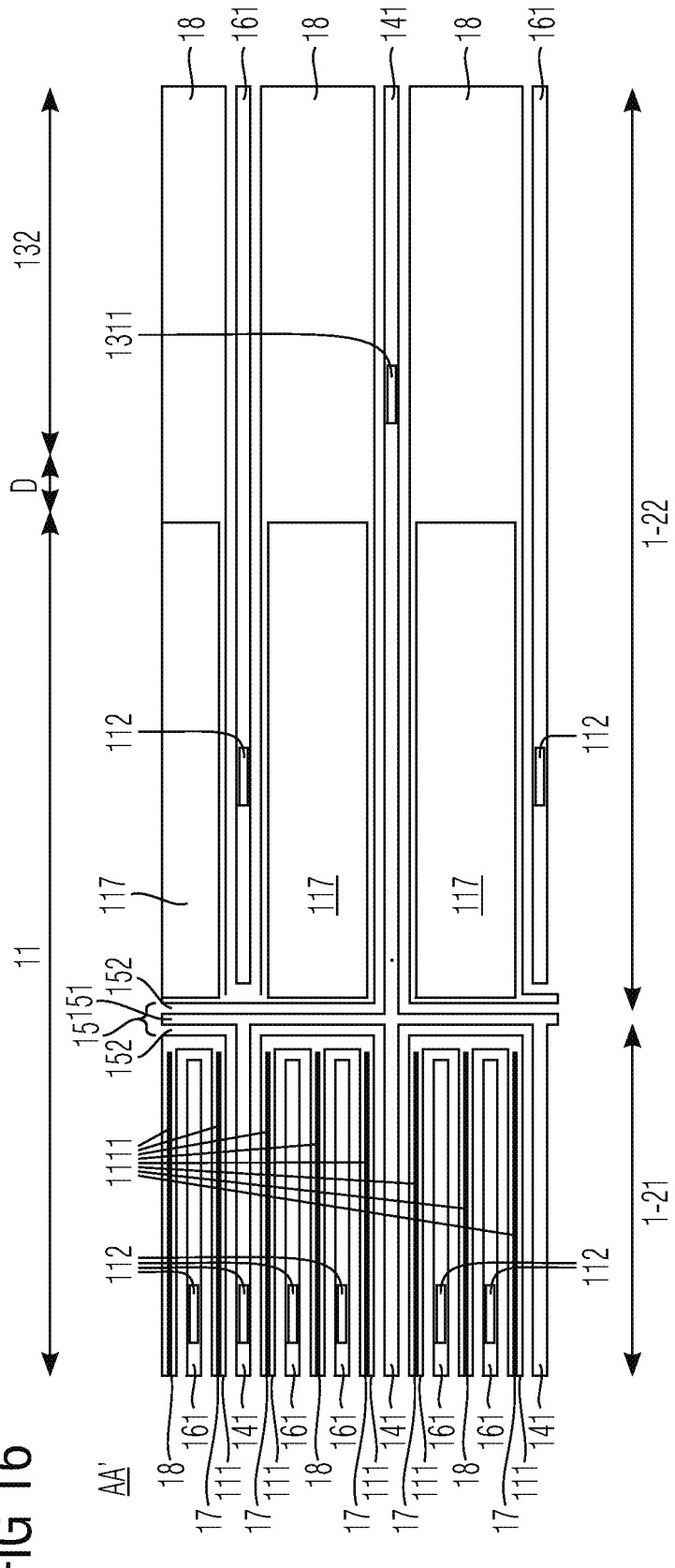
Figure 17:
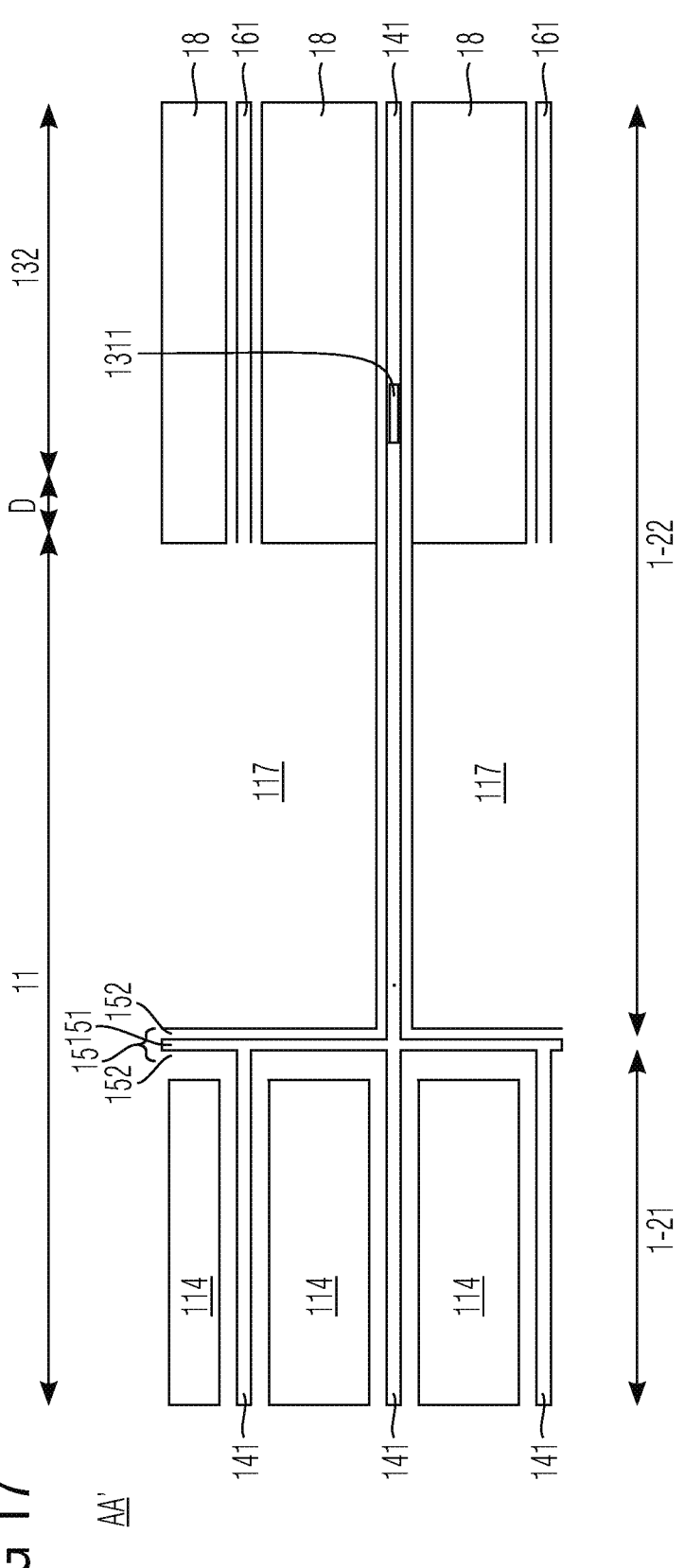
Figure 18:
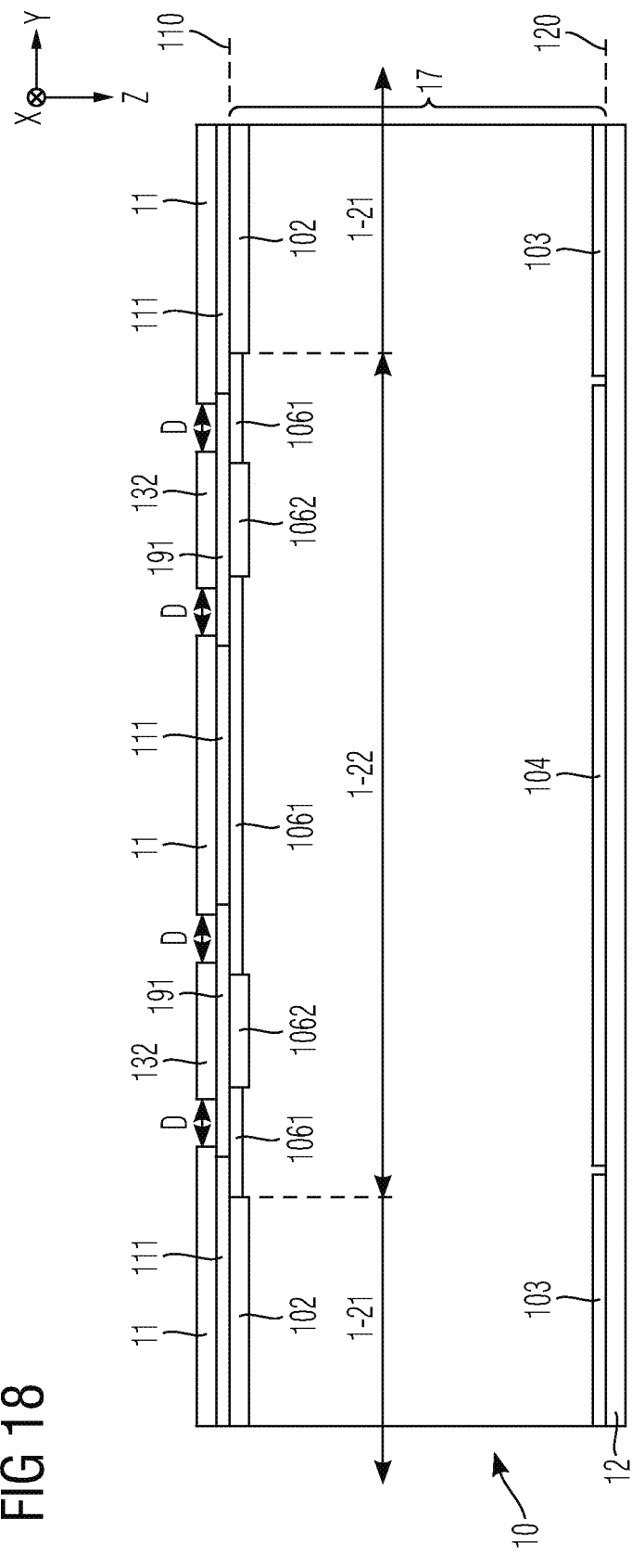
FIG. 18 schematically and exemplarily illustrates a section of a vertical cross-section of an RC IGBT in accordance with one or more embodiments.

FIG. 4, which schematically and exemplarily illustrates a section AA' of the horizontal projection of the exemplary RC IGBT 1 illustrated by FIG. 3 in more detail in accordance with one or more embodiments, FIG. 5, which schematically and exemplarily illustrates a section of a vertical cross-section BB' of the RC IGBT 1 illustrated in FIG. 4 in accordance with one or more embodiments;

FIG. 6, which schematically and exemplarily illustrates three variants of a section of a vertical cross-section CC' of the RC IGBT 1 illustrated in FIG. 4 in accordance with one or more embodiments, FIG. 7, which schematically and exemplarily illustrates a section of a vertical cross-section DD', of the RC IGBT 1 illustrated in FIG. 4 in accordance with one or more embodiments;

FIG. 8, which schematically and exemplarily illustrates sections of vertical cross-sections EE' and FF', respectively, of the RC IGBT 1 illustrated in FIG. 4 in accordance with one or more embodiments;

FIG. 9, which schematically and exemplarily illustrates sections of vertical cross-sections of a variation of the RC IGBT 1 illustrated in FIG. 4 in accordance with one or more embodiments;

FIG. 10, which schematically and exemplarily illustrates a section of a vertical cross-section BB' of the RC IGBT 1 illustrated in FIG. 4 in accordance with one or more embodiments;

FIG. 11, which schematically and exemplarily illustrates a variant of the configuration illustrated in FIG. 10 in accordance with one or more embodiments;

FIG. 12, which schematically and exemplarily illustrates a further variant of the configuration illustrated in FIG. 10 in accordance with one or more embodiments;

FIGS. 13-17, which each schematically and exemplarily illustrate a respective variant of the configuration illustrated in FIG. 4 in accordance with one or more embodiments; and to FIG. 18, which schematically and exemplarily illustrates a section of a vertical cross-section of an RC IGBT in accordance with one or more embodiments.

In accordance with these embodiments, the RC IGBT 1 comprises the active region 1-2 with at least one IGBT section 1-21 and, separate from the at least one IGBT section 1-21, at least one diode section 1-22; the semiconductor body 10 forming a part of the active region 1-2 and having the first side 110 and a second side 120; a first load terminal 11 at the first side 110 and a second load terminal 12 at the second side 120; a control terminal 13 at the first side 110, wherein the control terminal 13 is electrically insulated from the semiconductor body 10 and comprises the control terminal finger 132 that laterally overlaps, in the active region 1-2, with the diode section 1-22. The RC IGBT 1 further comprises the plurality of control trenches 14 extending into the semiconductor body 10 along the vertical direction Z. Each control trench 14 has a control trench electrode 141 electrically connected to the control terminal 13 and configured to control a load current between the first load terminal 11 and the second load terminal 12 in the IGBT section 1-21. At least one of the plurality of control trenches 14 extends into both the IGBT section 1-21 and the diode section 1-22. The electrical connection between the control trench electrode 141 of said at least one control trench 14 and the control terminal 13 is established at least based on an electrically conductive member 131 arranged, in the diode section 1-22, in contact with the control terminal finger 132.

Before describing aspects of the electrical connection between the control terminal 13 and the control trench electrode 141 of the at least one control trench 14 based on the electrically conductive member 131, further exemplary features of embodiments of the RC IGBT 1 shall be explained.

For example, with reference to FIG. 5, the semiconductor body 10 of the RC IGBT 1 may have said first side (herein also referred to as frontside) 110 and a second side (herein also referred to as backside) 120. The frontside 110 and the backside 120 may vertically terminate the semiconductor body 10.

A thickness of the semiconductor body 10 can be defined as the distance, in the active region 1-2, along the vertical direction Z between the frontside 110 and the backside 120.

In the lateral directions, the semiconductor body 10 may be terminated by the edge 1-4 (as described above with respect to FIGS. 1-3). Furthermore, both the frontside 110 and the backside 120 may extend laterally along both the first lateral direction X and the second lateral direction Y. For example, both the frontside 110 and the backside 120 may form a respective substantially horizontal surface of the semiconductor body 10.

In an embodiment, a total lateral extension of the IGBT section 1-21 in at least one of the first lateral direction X or the second lateral direction Y amounts to at least 50% of the semiconductor body thickness. The total lateral extension of the IGBT section 1-21 may also be greater than 50% of the thickness, e.g., greater than 2 times the thickness, or even greater than 5 times the thickness.

In an embodiment, a total lateral extension of each of the one or more diode sections 1-22 in at least one of the first lateral direction X or the second lateral direction Y amounts to at the semiconductor body thickness or to at least the thickness of a drift region 100. The total lateral extension of the diode section 1-22 may also be greater than the semiconductor body thickness. For example, the horizontal area of each of one or more diode sections 1-22 has a minimum lateral extension along the first lateral direction X and/or along the second lateral direction Y amounting at least 50% of the semiconductor body thickness or to at least 50% of the drift region thickness.

Furthermore, the diode section 1-22 may exhibit a stripe like configuration according to which its extension in one of the first and the second lateral directions (X or Y) is greater than its extension in the other one of the first and the second lateral directions (Y or X) by a factor of at least three, five or at least ten.

Also the control finger 132 may exhibit a stripe like configuration according to which its extension in one of the first and the second lateral directions (X or Y) is greater than its extension in the other one of the first and the second lateral directions (Y or X) by a factor of at least five, at least ten, at least twenty or even at least forty. At the same time, the smaller lateral extension of the diode section 1-22 may be at least three times or four times or five times greater as compared to the corresponding smaller lateral extension of the control finger 132 in the same lateral direction, as it is illustrated in FIG. 3; there, both the diode section 1-22 and the control finger 132 have substantially the same longer lateral extension in the first lateral direction, and a significantly smaller lateral extension in the second lateral direction Y, wherein the lateral extension of the control finger 132 in the second lateral directions is significantly smaller than the corresponding lateral extension of the diode section 1-22.

As explained above, both the first load terminal 11 and the control terminal 13 may be at the semiconductor body frontside 110, and a second load terminal 12 can be at the semiconductor body backside 120.

The IGBT section 1-21 is configured for conduction of a forward load current between the first load terminal 11 and the second load terminal 12, e.g., (in case of an n-channel IGBT) if the electrical potential at the second load terminal 12 is greater than the electrical potential at the first load terminal 11. The forward load current can hence be considered as an IGBT load current.

The diode section 1-22 is configured for conduction of a diode load current (herein also referred to as "reverse load current") between the first load terminal 11 and the second load terminal 12, e.g., if the electrical potential at the second load terminal 12 is lower than the electrical potential at the first load terminal 11. The diode load current can hence be considered as a reverse load current.

In an embodiment, the diode section 1-22, which conducts the diode load current, is spatially separated from the IGBT section 1-21, which conducts the forward load current. As indicated above, the diode section 1-22 is not part of the IGBT section 1-21, but separated therefrom, and does for example not include any source region 101 of the first conductivity type electrically connected to the first load terminal 11; rather, the diode section 1-22 is a "large diode-only region" of the active region 1-2, in accordance with some embodiments. Nonetheless, the IGBT section 1-21 may be arranged adjacent or directly adjoining to the diode section 1-22.

For example, in an embodiment, a path of the forward (IGBT) load current formed in the semiconductor body 10 and a path of the diode load current formed in the semiconductor body 10 do not spatially overlap considerably with each other. For example, none or less than 20% or even less than 10% of the forward (IGBT) load current flows through the diode section(s) 1-22.

Furthermore, in an embodiment, the current flow in the diode section 1-22 changes by less than 50%, or less than 30% or even less than 20% when a control signal provided to control trench electrodes 141 mentioned below is changed. For example, the diode section 1-22 is independent from the control signal. For example, the diode section 1-22 may be configured such that it conducts the diode load current as soon as the electrical potential (of the typical polarity) at the second load terminal 12 is lower (at least by the diode section internal threshold voltage) than the electrical potential at the first load terminal 11, irrespective of the control signal provided to the IGBT section 1-21, that is, irrespective of the current potential of the control trench electrodes 141.

In accordance with the terminology typically associated with RC IGBTs, the control terminal 13 can be a gate terminal, the first load terminal 11 can be an emitter terminal and the second load terminal 12 can be a collector terminal.

For example, the first load terminal 11 comprises a frontside metallization and/or the second load terminal 12 comprises a backside metallization. At the frontside 110, the semiconductor body 10 may locally interface with the frontside metallization. At the backside 120, the semiconductor body 10 may interface with the backside metallization.

In an embodiment, the first load terminal 11 (e.g., said frontside metallization) overlaps, that is, along the first lateral direction X and/or the second lateral direction Y and/or combinations thereof, with the active region 1-2. It shall be noted that the first load terminal 11 may be laterally structured, e.g., so as to establish local contacts with the semiconductor body 10 at the frontside 110. For example, as exemplary illustrated in FIGS. 4 and 5, said local contacts can be established by means of first and second contact plugs 111, 112 penetrating an insulation structure so as to contact mesas 17, 18 formed in the semiconductor body 10 and the source trench electrodes 161 included in the source trenches 16. For example, said local contacts can be established by means of contact holes through the insulation structure.

Analogously, in an embodiment, the second load terminal 12 (e.g., said backside metallization) overlaps, that is, along the first lateral direction X and/or the second lateral direction Y and/or combinations thereof, with the active region 1-2. It shall be noted that the second load terminal 12 is for example not structured but formed homogeneously and monolithically at the semiconductor body backside 120, e.g., so as to establish a laterally homogeneous contact (i.e., a contiguous contact surface) with the semiconductor body 10 at the backside 120. Such homogeneous structure may also be implemented in regions where the second load terminal 12 overlaps with the edge termination region 1-3.

For example, the lateral boundary of the active region 1-2 is defined by the lateral boundary of the outermost power cells of the IGBT section(s) 1-21 and or of the diode section(s) 1-22. Hence, the lateral boundary of the active region 1-2 may be defined at the frontside 110 (cf. FIG. 1). For example, all functional elements to enable conduction of the diode load current and the forward load current are present in the active region 1-2 of the RC IGBT 1, e.g., including at least a part of the first load terminal 11 (e.g., a frontside metal contact thereof, e.g., one or more of the first contact plugs 111), source region(s) 101, a body region 102 (or, respectively, an anode region 1061, 1062), a drift region 100, an IGBT emitter region 103, a diode emitter region 104 and the second load terminal 12 (e.g., a backside metal thereof), as will be explained in more detail below.

Furthermore, the lateral transition (along the first or second lateral direction X; Y or combinations thereof) between the active region 1-2 and the edge termination region 1-3 may extend exclusively along the vertical direction Z, in accordance with an embodiment. As explained above, the lateral boundary of the active region 1-2 may be defined at the frontside 110, and a vertical projection along the vertical direction Z of such defined lateral boundary may hence be theoretically observed at the backside 120.

Now also referring to FIGS. 8 and 9 in more detail, a plurality of trenches may extend into the semiconductor body 10. The trenches may include one or more control trenches 14, one or more dummy trenches, and/or one or more source trenches 16.

The RC IGBT 1 may exhibit a specific trench-mesa-pattern, wherein it shall be understood that other patterns as the ones illustrated may be employed. Aspects of exemplary trench designs and mesa designs will be described in the following.

For example, referring to FIG. 4, the RC IGBT 1 may in addition to the control trenches 14 comprise the source trenches 16 extending into the semiconductor body 10 along the vertical direction Z, wherein each source trench 16 has a source trench electrode 161 electrically connected to the first load terminal 11 and extends at least into one of the IGBT section 1-21 and the diode section 1-22.

The trenches 14, 16 spatially confine a plurality of mesas. For example, the plurality of trenches 14, 16 exhibit a respective stripe configuration and are arranged laterally adjacent to each other in accordance with a specific trench-mesa-pattern.

For example, the RC IGBT 1 may comprise a plurality of first type mesas 17 as part of the semiconductor body 10, wherein each first type mesa 17 is electrically connected to the first load terminal 11 and, e.g., at least in the IGBT section 1-21 laterally confined by at least one of the control trenches 14. For example, the first type mesa 17 has a diode portion with a diode configuration in the diode section 1-21 and an IGBT portion with an IGBT configuration in the IGBT section 1-21. That is, depending on whether the first type mesa 17 is arranged in the IGBT section 1-21 or in the diode section 1-22, it may either act as diode mesa or as IGBT mesa, which will be described in more detail below.

For example, the RC IGBT 1 may further comprise a plurality of second type mesas 18 as part of the semiconductor body 10, wherein each second type mesa 18 may be laterally confined by respective two of the source trenches 16. For example, the second type mesa 18 has no IGBT configuration. For example, the second type mesa 18 may either be a "diode-only" mesa or a dummy mesa, which will be explained further below.

The trenches are arranged in parallel to each other along the first lateral direction X and extend into the semiconductor body 10 along the vertical direction Z. Each trench may have a stripe configuration extending along the second lateral direction Y from a respective first section of the lateral circumference of the active region 1-2 (cf. FIG. 3) towards a respective second section of the lateral circumference opposite to the respective first section. As described, each trench may house a respective trench electrode 141, 161 that may or may not be electrically connected to a defined electrical potential, e.g., to the potential of one of the control terminal 13 or the first load terminal 11. For example, the trench electrodes of the dummy trenches are electrically floating, e.g., not connected to a defined electrical potential. That is, the electrical potentials of the trench electrodes may differ from each other. In an embodiment, the dummy trenches are not implemented; i.e., the RC IGBT 1 then comprises trenches predominantly in the form of control trenches 14 and source trenches 16.

The trench electrodes 141, 161 are isolated from the semiconductor body 10 by a respective trench insulator 142, 162.

Two adjacent trenches may define a respective mesa in the semiconductor body 10. The mesas include first type mesas 17 and second type mesas 18 and, optionally, dummy mesas.

For example, each trench 14, 16 may have a stripe configuration, meaning that the respective trench length (e.g., along the second lateral direction Y) is much greater than the respective trench width (e.g., along the first lateral direction X). Hence, also each mesa 17, 18 may have a stripe configuration.

The trench electrodes 141 can be electrically connected to the control terminal 13 and are hence referred to as control trench electrodes 141. Via the control terminal 13, the control trench electrodes 141 may be provided with said control signal.

If the optional dummy trenches are provided, the trench electrodes (or a subset thereof) can be electrically floating are hence referred to as floating trench electrodes. In another embodiment, the trench electrodes (or a subset thereof) of the dummy trenches are electrically connected to the control terminal 13 but do not directly control conduction of the load current as no electrically connected source region 101 (connected to the first load terminal 11) is arranged adjacent to the respective dummy trench. In yet another embodiment, the trench electrodes of the dummy trenches (or a subset thereof) are connected to an electrical potential different from the electrical potential of the control terminal 13 and different from the electrical potential of the first load terminal 11.

The trench electrodes 161 of the source trenches 16 can be electrically connected to the first load terminal 11 and are hence referred to as source trench electrodes 161.

Each trench type can be of equal dimensions in terms of width along the first lateral direction X and depth along the vertical direction Z (e.g., a distance between frontside 110 and a trench bottom) and/or length along the second lateral direction Y.

The IGBT section 1-21 may comprise a plurality of IGBT cells, each IGBT cell having a certain trench pattern, i.e., a lateral sequence (along the first lateral direction X) of trenches of specific types, e.g. one or more control trenches 14, zero or more dummy trenches, and zero or more source trenches 16 and zero or more other trenches.

Analogously, each of the one or more diode sections 1-22 may comprise a number of diode cells, each diode cell having a certain trench pattern, i.e., a lateral sequence of trenches of specific types, e.g. zero or more dummy trenches, one or more source trenches 16 and/or zero or more other trenches.

It may be provided that the trenches in both the IGBT section 1-21 and the diode section 1-22 are laterally arranged next to one another in accordance with the same pitch; e.g., the mesa width (that is, the distance along the first lateral direction X between two adjacent trenches) does not alter between the sections 1-21 and 1-22, in accordance with an embodiment.

The mesa width may, in an embodiment, amount to no more than $\frac{1}{30}$ or to no more than $\frac{1}{60}$ of the semiconductor body thickness.

Also, the trenches 14, 16 may, in an embodiment, each exhibit the same trench depth (total vertical extension). For example, the mesa width amounts to no more than 50% or to no more than 30% of the trench depth.

In an embodiment, the mesa width may amount to no more than 10 µm, or no more than 5 µm, or no more than 1 µm. For example, in the latter case, adjacent trenches are hence laterally displaced from each other by no more than 1 µm.

As explained above, the mesa width may be identical for both sections 1-21 and 1-22, or it varies between the sections. In a further embodiment, the mesa width in the IGBT section 1-21 is less than 80%, less than 65% or even less than 50% of the mesa width in the diode section 1-22. For example, the average density of the total of the trench electrodes 141, 161 can be also be same for both sections 1-21 and 1-22. However, the trench pattern, e.g., the arrangement of the different types of trenches may vary between the sections 1-21 and 1-22. One exemplary variation is that the density of control trench electrodes 141 in the IGBT section 1-21 is at least twice as high as the density of control trench electrodes 141 in the diode section 1-22 (which may even amount zero).

In an illustrative example, the total number of trench electrodes 141, 161 in the IGBT section 1-21 is 120, and 40 trench electrodes are control trench electrodes 141, yielding a control trench electrode density of $\frac{1}{3}$. For example, the total number of trench electrodes in the diode section 1-22 is fifty, and no more than five trench electrodes are control trench electrodes 141, yielding an control trench electrode density of no more than $\frac{1}{10}$.

In an embodiment, at least 50% of the trench electrodes of the trenches in the diode section 1-22 are electrically connected to the first load terminal 11, i.e., at least 50% of the trench electrodes of the trenches in the diode section 1-22 are source trench electrodes 161 of source trenches 16. In an embodiment, each of the trench electrodes in the diode section 1-22 is a source trench electrode 141.

In an embodiment, at least 50% of the trench electrodes of the trenches in the IGBT section 1-21 are electrically connected to the first load terminal 11, i.e., at least 50% of the trench electrodes of the trenches in the IGBT section 1-21 are source trench electrodes 161 of source trenches 16.

For example, most of the trench electrodes in the diode section 1-22 are source trench electrodes 161. Furthermore, all or some of the second type mesas 18 in the diode section 1-22 may be electrically connected to the first load terminal 11, e.g., by means of the first contact plugs 111.

Now referring to FIGS. 5 to 9, the RC-IGBT 1 further comprises a drift region 100 of the first conductivity type formed in the semiconductor body 10 and extending into the diode section 1-22 and the IGBT section 1-21.

A body region 102 of the second conductivity type is formed in the first type mesas 17 and an anode region 1061, 1062 of the second conductivity type may be formed in both the first type mesas 17 and the second type mesas 18. At least portions of the body region 102 are electrically connected to the first load terminal 11. The body region 102 may form pn-junctions to mesa subsections of the first conductivity type.

Further, one or more mesas (not illustrated) in at least one of the diode section 1-22 and the IGBT section 1-21 may not be electrically connected to the first load terminal 11 in order to form "dummy mesas", i.e., those mesas not used for load current conduction, neither for forward load current nor for reverse load current conduction.

In the IGBT section 1-21, source regions 101 of the first conductivity type are arranged at the frontside 110 and electrically connected to the first load terminal 11. The source regions 101 are, e.g., only locally provided in the IGBT section 1-21 and do for example not extend into the diode sections 1-22.

The body region 102 may be arranged in electrical contact with the first load terminal 11, e.g., by means of the first contact plugs 111. In each IGBT cell of the IGBT section 1-21, there can furthermore be provided at least one of the source regions 101 of the first conductivity type arranged in electrical contact with the first load terminal 11, e.g., also by means of the first contact plugs 111.

A larger part of the semiconductor body 10 is formed as the drift region 100, which is of the first conductivity type, and which may interface with the body region 102 and form a pn-junction 1021 therewith. The body region 102 isolates the source regions 101 from the drift region 100. Herein, the term "body region 102" refers to the semiconductor region of the second conductivity type electrically connected, at the frontside 110, to the first load terminal 11. The region 102 extends into the IGBT section 1-21 and the anode region 1061, 1062 extends into the diode section 1-22. The implementation of the body region 102 in the IGBT section 1-21 may not or may differ from the implementation of the anode region 1061, 1062 in the diode sections 1-22, e.g., in terms of dopant concentration, dopant dose, dopant profile and/or spatial extension.

Upon receipt of the control signal, e.g., provided by a non-illustrated gate driver unit, each control trench electrode 141 can induce an inversion channel in a section of the body region 102 adjacent to the respective control trench electrode 141. Thus, each of the number of IGBT cells may be configured for conducting at least a portion of the forward load current between the first load terminal 11 and the second load terminal 12.

In an embodiment, the drift region 100 extends along the vertical direction Z, until it merges into a field stop layer 108 (cf. FIG. 11), wherein the field stop layer 108 is also of the first conductivity type, but exhibits a higher dopant dose as compared to the drift region 100. The field stop layer 108 is typically of significantly smaller thickness than the drift region 100.

The drift region 100, or, if present, the field stop layer 108, extends along the vertical direction Z until adjoining, for example, an IGBT emitter region 103 of the IGBT section 1-21 or a diode emitter region 104 of the diode section 1-22. At least in some parts of the lateral extension of the semiconductor body 10, where according to some embodiments no IGBT emitter region 103 or diode emitter region 104 is present, the drift region 100 or, respectively, the field stop layer 108 may adjoin the second load terminal 12 or another optional semiconductor region.

The diode emitter region 104 is of the first conductivity type and electrically connected to the second load terminal 12 and coupled to the drift region 100, e.g., by means of the field stop layer 108.

The IGBT emitter region 103 is of the second conductivity type and electrically connected to the second load terminal 12 and coupled to the drift region 100, e.g., by means of the field stop layer 108.

For example, the drift region thickness mentioned herein is the distance, along the vertical direction Z, between the pn-junction 1021 of one of the first type mesas 17 of the IGBT section 1-21 and a transition between the drift region and the field stop layer 108, wherein said transition can e.g. be located at a vertical level where the dopant concentration has increased, along the vertical direction Z, by at least by a factor of two Both the IGBT emitter region 103 of the IGBT section 1-21 and the diode emitter region 104 of the diode section 1-22 can be arranged in electrical contact with the second load terminal 12.

Overall, the IGBT emitter region 103 may act as an emitter of the second conductivity type. Furthermore, the IGBT emitter region 103 does in some embodiments not comprise any section of the first conductivity type, which exhibit a rather high dopant concentration, typically in the range of $10^{16}$ cm$^{-3}$ to $10^{20}$ cm$^{-3}$, rather, the diode cathode region 104 is exclusively formed in the diode section 1-22, in accordance with some embodiments. In other embodiments, the IGBT emitter region 103 may comprise one or more sections of the first conductivity type, e.g., only in a certain subsection of the IGBT emitter region 103.

In an embodiment, the average dopant concentration of the drift region 100 may be in the range of $10^{12}$ cm$^{-3}$ to $10^{14}$ cm$^{-3}$.

In an embodiment, the dopant concentration of each source region 101 in the IGBT section 1-21 may be in the range of $10^{19}$ cm$^{-3}$ to $10^{21}$ cm$^{-3}$.

In an embodiment, the dopant concentration of the body region 102 may be in the range of $10^{16}$ cm$^{-3}$ to $10^{18}$ cm$^{-3}$. As described above, e.g., the dopant concentration of the body region 102 in the IGBT section 1-21 may be equal to or different from the dopant concentration of the anode region 1061, 1062 in the diode section 1-22.

In an embodiment, the dopant concentration of the (optional) field stop layer 108 may be in the range of $10^{14}$ cm$^{-3}$ to $3*10^{16}$ cm$^{-3}$.

In an embodiment, the dopant concentration of the IGBT emitter region 103 may be in the range of $10^{16}$ cm$^{-3}$ to $10^{18}$ cm$^{-3}$. However, in an embodiment, the net dopant concentration may vary (and even change is polarity) along the lateral extension of the IGBT emitter region 103.

In an embodiment, the dopant concentration of the diode emitter region 104 may be in the range of $10^{19}$ cm$^{-3}$ to $10^{21}$ cm$^{-3}$. However, in an embodiment, the net dopant concentration may vary (and even change is polarity) along the lateral extension of the diode emitter region 104.

It shall be noted that the illustrated trench patterns are only exemplary; other trench patterns are possible.

In an embodiment, the diode section 1-22 is not equipped with source regions 101, e.g., at least not with source regions 101 arranged adjacent to a respective one of the control trenches 14. For example, in the diode section 1-22, there is no doped semiconductor region of the first conductivity type electrically connected to the first load terminal 11. Rather, for forming the diode configuration in the diode section 1-22 for conduction of the diode load current, only the anode region 1061, 1062 is electrically connected to the first load terminal 11, wherein the anode region 1061, 1062 forms a pn-junction with, e.g., the drift region 100, and wherein below said pn-junction and along the vertical direction Z towards the second load terminal 12, there is a semiconductor path of only the first conductivity type, not interrupted by any further regions of the second conductivity type.

As explained above, in contrast to the diode section 1-22, the IGBT section 1-21 comprises at least one IGBT cell with a section of the source region 101 connected to the first load terminal 11 and arranged adjacent to one of the control trenches 14 and isolated from the drift region 100 by the body region 102, in accordance with an embodiment. For example, the lateral boundary of the IGBT section 1-21 is defined by the lateral boundary of the outermost IGBT cell(s). Hence, the lateral boundary of the IGBT section 1-21 may be defined at the frontside 110. This lateral boundary can be defined by (an) outermost source region(s) 101. For example, all functional elements to enable conduction of the forward/IGBT load current are present in a vertical projection of the IGBT section 1-21 of the power semiconductor device 1, e.g., including at least the first load terminal 11 (e.g., a frontside metal contact thereof, e.g., one or more of the first contact plugs 111), the source region(s) 101, the body region 102, the drift region 100, the IGBT emitter region 103, and the second load terminal 12 (e.g., a backside metal thereof). Furthermore, said functional elements may extend along the total lateral extension of the IGBT section 1-21.

In an embodiment, said first contact plugs 111 are part of a contact plug structure of the power semiconductor device 1. Each first contact plug 111 can be configured to establish contact with one of the mesas 17, 18 so as to electrically connect that mesa 17/18 to the first load terminal 11. As illustrated, each first contact plug 111 may extend from the frontside 110 along the vertical direction Z into the respective mesa 17/18.

Instead of first contact plugs 111, also planar contacts may be used to establish the electrical connection between the mesas 17, 18 and the first load terminal 11. The same applies for the second contact plugs.

For example, in accordance with FIG. 3, the RC IGBT 1 comprises four diode sections 1-22, and four control terminal fingers 1-32 are provided, each of which extends, as illustrated, into a respective one of the four diode sections 1-22. The trenches 14, 16 (cf. FIG. 4 et seq.) may have a stripe configuration, but, e.g., extend perpendicular to the stripe configuration of the control fingers 132 and the diode sections 1-22.

Instead of diode sections 1-22 having a rectangular horizontal circumference, also differently shaped diode sections 1-22 may be provided, e.g., circular diode sections.

Irrespective of the shape of the diode section(s) 1-22, it may be ensured that at least 50% or at least 80% of a lateral circumference of each diode section 1-22 is surrounded by the IGBT section(s) 1-21. Even 100% of the lateral circumference of respective diode section 1-22 may be surrounded by the IGBT section 1-21, e.g., if the diode section 1-22 is place somewhere in the active region 1-2 without intersecting the edge termination region 1-3.

For example, the proposed design allows using the area of the control terminal fingers 132 as active area.

With respect to FIG. 4, a first implementation for establishing the electrical connection between the control terminal 13 and the control trench electrode 141 of the at least one control trench 14 based on the electrically conductive member 131 shall be described.

FIG. 4 shows both a part of the IGBT section 1-21 and a part of the adjacent diode section 1-22. The first load terminal 11 extends into both the IGBT section 1-21 and the diode section 1-22. In the diode section 1-22, there is also the control terminal finger 132, but spaced apart from the load terminal 11 by distance D (cf. also FIG. 5). The control finger 132 may have a stripe configuration extending in the first lateral direction X, whereas the trenches 14, 16 may have a stripe configuration extending in the second lateral direction Y.

In accordance with the exemplarily illustrated trench-mesa-pattern, each control trench 14 (housing a respective control trench electrode 141) is laterally flanked by respective two adjacent source trenches 16 (housing a respective source trench electrode 161). Each pair of a control trench 14 and a source trench 16 laterally confines one of the first type mesas 17, and each pair of source trenches 16 laterally confines one of the second type mesas 18.

Further in accordance with the embodiment illustrated in FIG. 4, the trench-mesa-pattern is the same for both the diode section 1-22 and the IGBT section 1-21.

With respect to the subsequent drawings, the contacting of the trench electrodes 141 and 161 and the mesas 17 and 18 will now be described.

For example, referring to FIG. 5, which shows a vertical cross-section along line BB', i.e., through one of the first type mesas 17, the first type mesa 17 is electrically connected to the first load terminal 11 based on the first contact plug 111. The first contact plug 111 (not illustrated in FIG. 4) is in contact with the first load terminal 11 on the one side and, on the other side, with both the body region 102 of the first type mesa 17 in the IGBT section 1-21 and a first anode region 1061 of the first type mesa 17 in the diode section 1-22. That is, the first contact plug 111 may extend into both the diode section 1-22 and the IGBT section 1-21, and, as explained above, the first type mesa 17 has an IGBT configuration in the IGBT section 1-21 (where the first type mesa 17 also includes the source region 101 that is not illustrated in FIG. 5) and, in the diode section 1-22, the first type mesa 17 has a diode configuration with no source region 101. In the diode section 1-22, the first anode region 1061 is electrically insulated from the control terminal finger 132, e.g., based on insulation layer 191.

In the first type mesa 17, the body region 102 and the first anode region 1061 are of the same conductivity type (e.g., the second conductivity type) and form a contiguous semiconductor region. The body region 102 may, however, have a greater dopant concentration than the first anode region 1061 and/or may extend further along the vertical direction than the first anode region 1061.

The body region 102 may exhibit a dopant dose within the range of $5*10^{12}$ cm$^{-2}$ to $1*10^{14}$ cm$^{-2}$.

The first anode region 1061 may exhibit a dopant dose within the range of $1*10^{12}$ cm$^{-2}$ to $1*10^{14}$ cm$^{-2}$ or within the range of $1*10^{12}$ cm$^{-2}$ to $2*10^{13}$ cm$^{-2}$, or within the range of $1*10^{13}$ cm$^{-2}$ to $1*10^{14}$ cm$^{-2}$.

As used herein, the term average dopant concentration of a semiconductor region relates to the spatial average dopant concentration, e.g., the number of dopants divided by the volume of the region. As used herein, the term dopant dose relates to the dopant concentration integrated along the vertical direction Z.

Now referring to FIG. 6, variants (1) to (3), which each show a vertical cross-section along line CC' indicated in FIG. 4, i.e., through one of the control trenches 14, the control trench electrode 141 is separated from the first load terminal 11 based on the insulation layer 191 and from the semiconductor body 10 based on control trench insulator 142.

According to variant (1), the control trench electrode 141 of the at least one control trench 14 laterally overlaps, in the diode section 1-22, with the control terminal finger 132. Further, the electrically conductive member 131 is then e.g. formed as a control contact plug 1311 extending, along the vertical direction Z, from the control terminal finger 132 to the portion of the control trench electrode 141 that laterally overlaps with the control terminal finger 132. That is, the control contact plug 1311 is arranged in the diode section 1-22, which is also illustrated for two other control trenches 14 in FIG. 4.

For example, said at least one control trench 14 (that is electrically connected with the control terminal finger 132 in the diode section 1-22) may extend laterally from a first portion of the IGBT section 1-21 (e.g., FIG. 3, at reference numeral A) to cross the diode section 1-22 and extend into another portion of the IGBT section 1-21 (e.g., FIG. 3, at reference numeral A"), wherein both of said portions of the IGBT section 1-21 are arranged adjacent to the diode section 1-22.

Generally, the control trench electrodes 141 that extend into the diode section 1-22 may be used as integrated resistors, which may save some additional chip area. The value of the integrated resistor can be controlled by a proper choice of the number of control trenches 14 in the diode section 14 and their lengths between the connection to the control terminal finger 132 and the control trench portions 141 in the IGBT section 1-21 (e.g., by the amount of the total volume of the control trench electrodes 141 in the diode section 1-22). For example, the resistor may also be adjusted by providing meander like structures or other windings below the control terminal finger 132.

However, here, it shall already be understood that electrically connecting the control trench electrodes 141 with the control terminal finger 132 does not necessarily require that each control trench electrode 141 extends into the diode section 1-22. As will be described further below, it may be sufficient that only a subset or only one of the control trench electrodes 141 extends into the diode section 1-22.

It may even be provided, as illustrated in FIG. 6, variants (2) and (3), that the control trench electrode 141 does not extend into the diode section 1-22. For example, in such case, the control trench electrode 141 of the at least one control trench 14 does not laterally overlap, in the diode section 1-22, with the control terminal finger 132. For example, at the transition between the IGBT section 1-21 and the diode section 1-22, the control trench electrode 141 adjoins a portion of the electrically conductive member 131 arranged above insulation layer 191. Said portion of the electrically conductive member 131 may then be planar and extend laterally from the control terminal finger 132 towards the IGBT section 1-21 and above the insulation layer 191 at the first side 110, as illustrated in FIG. 6, variants (2) and (3). In these cases, even the control electrodes could be planar electrodes not arranged in control trenches 14 (not shown here). Thus, the proposed connection scheme does not necessarily require that the control electrodes in the IGBT section 1-21 are trench electrodes. As illustrated in variants (2) and (3), the control trench electrode 141 may either slightly extend into the diode section 1-22 (cf. variant (2)) or, respectively, terminate in the IGBT section 1-21 (cf. variant (3)). In the latter case, the control trench electrode 141 does not laterally overlap with the diode emitter region 104.

Now referring to FIG. 7, which shows a vertical cross-section along line DD' indicated in FIG. 4, i.e., through one of the source trenches 16, the source trench electrode 161 is separated from both the control terminal finger 132 based on the insulation layer 191 and separate from the semiconductor body 10 based on source trench insulator 162. In the example, the source trench electrode 161 of the source trench 16 is electrically connected to the first load terminal 11 in the diode section 1-22 based on one of the second contact plugs 112, as also illustrated for four other source trenches 16 in FIG. 4. Alternatively or additionally, one of the second contact plugs 112 may be placed in the IGBT section 1-21.

To further facilitate understanding of the exemplary embodiment of FIG. 4, FIG. 8 shows two cross-sections of the IGBT section 1-21 along lines EE' (part (1)) and FF' (part (2) indicated in FIG. 4. Lines EE' and FF' are perpendicular to lines CC', BB' and DD'. The trench-mesa-pattern has already been described above. Both the first type mesas 17 and the second type mesas 18 are electrically connected to the first load terminal based on a respective first contact plug 111 (not illustrated in FIG. 4). Only the first type mesas 17 comprise source regions 101. The second type mesas 18 comprise no source regions 101. Unlike the body region 102, the source regions 101 are only locally provided along the second lateral direction Y, as illustrated: At line EE', there are source regions 101 in the first type mesas 17, and at line FF', there are no source regions 101 in the first type mesas 17. The dimensioning and positioning of the source regions 101 depends on the targeted application of the RC IGBT 1.

FIG. 9 illustrates a variant of the contacting scheme explained above with respect to FIG. 8. For example, referring to variant (1)—corresponding to variant (1) of FIG. 8—instead of or in addition to the first and second contact plugs 111 and 112, wide joint contacts 114 may be used to electrically contact both the source trench electrodes 161 and the adjacent mesas. For example, one joint contact 114 may electrically contact both the source trench electrodes 161 of two adjacent source trenches 16, as well as the second type mesa 18 in between thereto and the two first type mesas 17 adjacent thereto. For example, referring to variant (2)—corresponding to variant (2) of FIG. 8—instead of or in addition to the first contact plugs 111, flat contacts 115 may be used to electrically contact both the first and second type mesas 17, 18. For example, the flat contacts 115 terminate approximately at the front side 110 of the semiconductor body 10 and do not extend into the mesa portions.

FIG. 10 shows a vertical cross-section along line BB' illustrated in FIG. 4, i.e., through one of the first type mesas 17. What has been described with respect to FIG. 5 likewise applies to FIG. 10. FIG. 10 illustrates a variation of the anode region 1061 in the portion of the first type mesa 17 that extends into the diode section 1-22. For example, the anode region comprises a first portion 1061 (also referred to as first anode region 1061) laterally overlapping with the first load terminal 11 and, in contact therewith, a second portion 1062 (also referred to as second anode region 1062) laterally overlapping with control terminal finger 132. For example, the body region 102, the first anode region 1021 and the second anode region 1062 are all of the second conductivity type and form a contiguous region. But, the dopant concentrations of the regions 102, 1061 and 1062 may differ, as well as the total extensions in the vertical direction Z.

For example, the dopant dose of the second portion (second anode region) 1062 is at least 10 times as high as compared to the dopant dose of the first portion (first anode region) 1061.

Here, it shall be noted that the second type mesa 18 may exhibit the same configuration as the first type mesa 17, in particular with regards to the body region 102 and the anode regions 1061, 1062; the only difference being that the second type mesa 18 is not equipped with source regions 101.

The second anode region 1062 may exhibit a dopant dose within the range of $1*10^{12}$ cm$^{-2}$ to $1*10^{14}$ cm$^{-2}$ or within the range of $1*10^{12}$ cm$^{-2}$ to $2*10^{13}$ cm$^{-2}$, or within the range of $1*10^{13}$ cm$^{-2}$ to $5*10^{14}$ cm$^{-2}$.

For example, the average dopant concentration of the second anode region 1062 is within the range of 50% to 1000% of the average dopant concentration of the first anode region 1061. Hence, the average dopant concentration of the second anode region 1062 may be identical, smaller or greater as compared to the average dopant concentration of the first anode region 1061. Which variant is chosen may, e.g., depend on the designated emitter efficiency of the diode section 1-22.

Further, the average dopant concentration of the first anode region 1061 can be lower as compared to the average dopant concentration of the body region 102. Here, it is noted that directly below the first contact plug 111, highly doped contact regions may be placed, e.g. by implantation. The dopant doses and the average dopant concentrations of the body region 102 and the first and second anode region 1061, 1062 are defined without the doping of these highly doped contact regions.

The difference in dopant concentration between the first and second anode region 1061 and 1062 may take into account that the second anode region 1062 may laterally overlap with the control terminal finger 132; i.e., in the second anode region 1062, there may be a lateral voltage drop due to absence of a vertically extending connection between the second anode region 1062 and the first load terminal 11.

For example, the second portion (second anode region) 1062 of the anode region is laterally displaced from the first load terminal 11 or, respectively, from an adjacent one of the first contact plugs 111 by at least 500 nm, or at least 2 μm, cf. distance d illustrated in FIG. 10. Thereby, it may be ensured that the desired emitter efficiency is primarily defined based on the first anode region 1061 that is electrically connected to the first load terminal 11 based on the contact plug 111 and, simultaneously, that a low lateral voltage drop is ensured based on the higher doped second anode region 1062 below the control terminal finger 132, in accordance with some embodiments.

FIG. 11 shows a vertical cross-section along line BB' illustrated in FIG. 4, i.e., through one of the first type mesas 17. What has been described with respect to FIG. 10 likewise applies to FIG. 11. FIG. 11 illustrates a variation where the above described field stop layer 108 is implemented at the second side 120. The field stop layer 108 may extend into both the diode section 1-22 and the IGBT section 1-21, e.g., so as to adjoin both the IGBT emitter region 103 of the second conductivity type and the diode emitter region 104 of the first conductivity type. FIG. 11 also illustrates a variation of the second anode region 1062; accordingly, the second anode region 1062 may terminate below the control finger 132, and the drift region 100 adjoins the frontside 110, e.g., at the insulation layer 191.

FIG. 12 shows a vertical cross-section along line BB' illustrated in FIG. 4, i.e., through one of the first type mesas 17. What has been described with respect to FIG. 11 concerning the field stop layer 108 likewise applies to FIG. 12. FIG. 12 illustrates a variation of the backside emitter. For example, the diode section 1-22 not only comprises the diode emitter regions 104 in electrical contact with the second load terminal 12, but also subregions 1031 of the second conductivity type in electrical contact with the second load terminal 12. The subregions 1031 and the diode emitter regions 104 may be arranged in an alternating manner along the second lateral direction Y, as illustrated. Additionally providing the subregions 1031 of the second conductivity type in electrical contact with the second load terminal 12 allows a smoother switching behavior during diode commutation by means of charge carrier injection from the subregions 1031 into the drift region 100

FIGS. 13-17 each schematically and exemplarily illustrate a respective variant of the configuration illustrated in FIG. 4 in accordance with one or more embodiments. If not stated otherwise, everything what has been described above likewise applies to FIGS. 13-17.

As indicated above, it is not necessary that each control trench 14 extends into the diode section 1-22. For example, it may be desirable, e.g., for a reduction of the influence of the control signal on the reverse conduction properties, that only a small amount of the total control trench electrodes 141 is present in the diode section 1-22. For example, having none or only "little control trench electrode potential" in the diode section 1-22 may effect that the diode section 1-22 is substantially independent of the control signal provided to the control trench electrode. Also, the RC IGBT 1 would have less total gate charge, which may be desirable in certain configurations.

Figure 13:
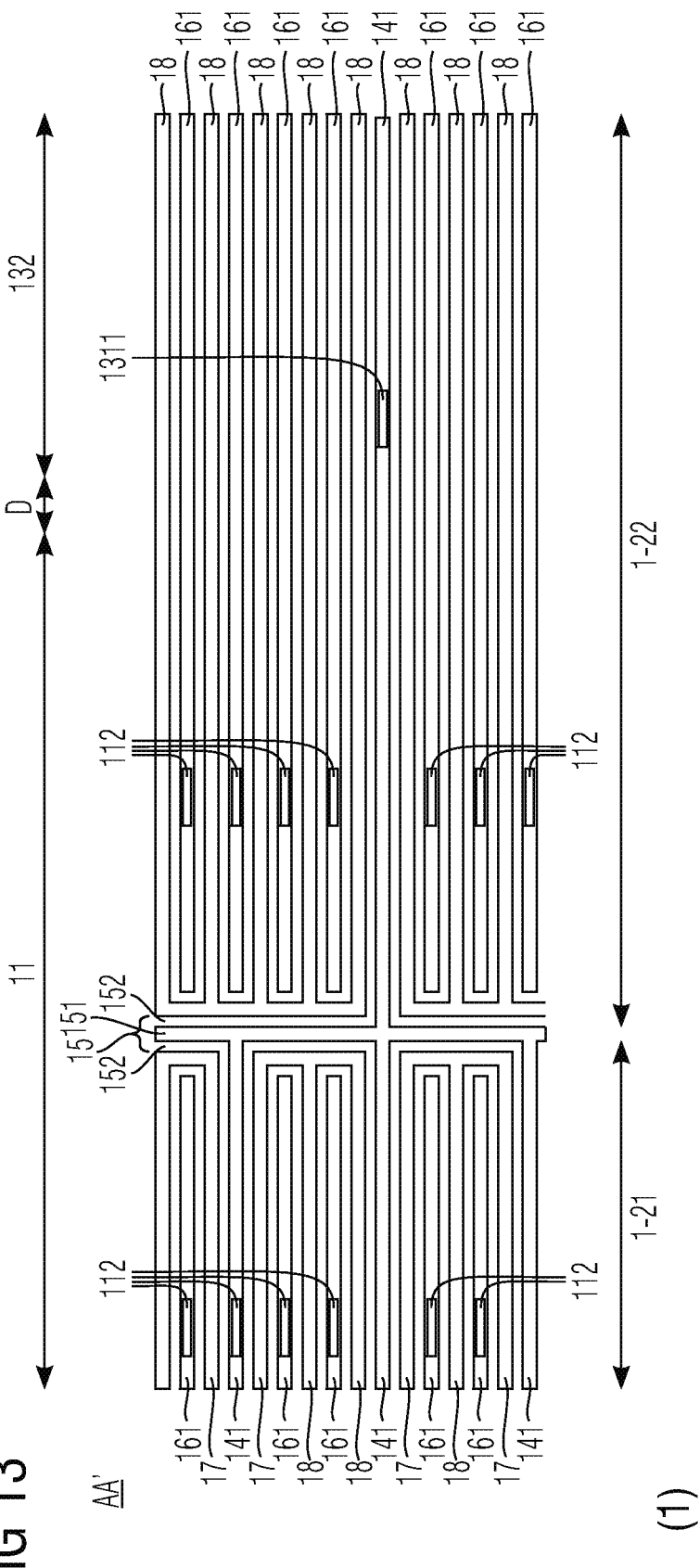
FIGS. 13-17 each schematically and exemplarily illustrate a respective variant of the configuration illustrated in FIG. 4 in accordance with one or more embodiments.
Figure 13:
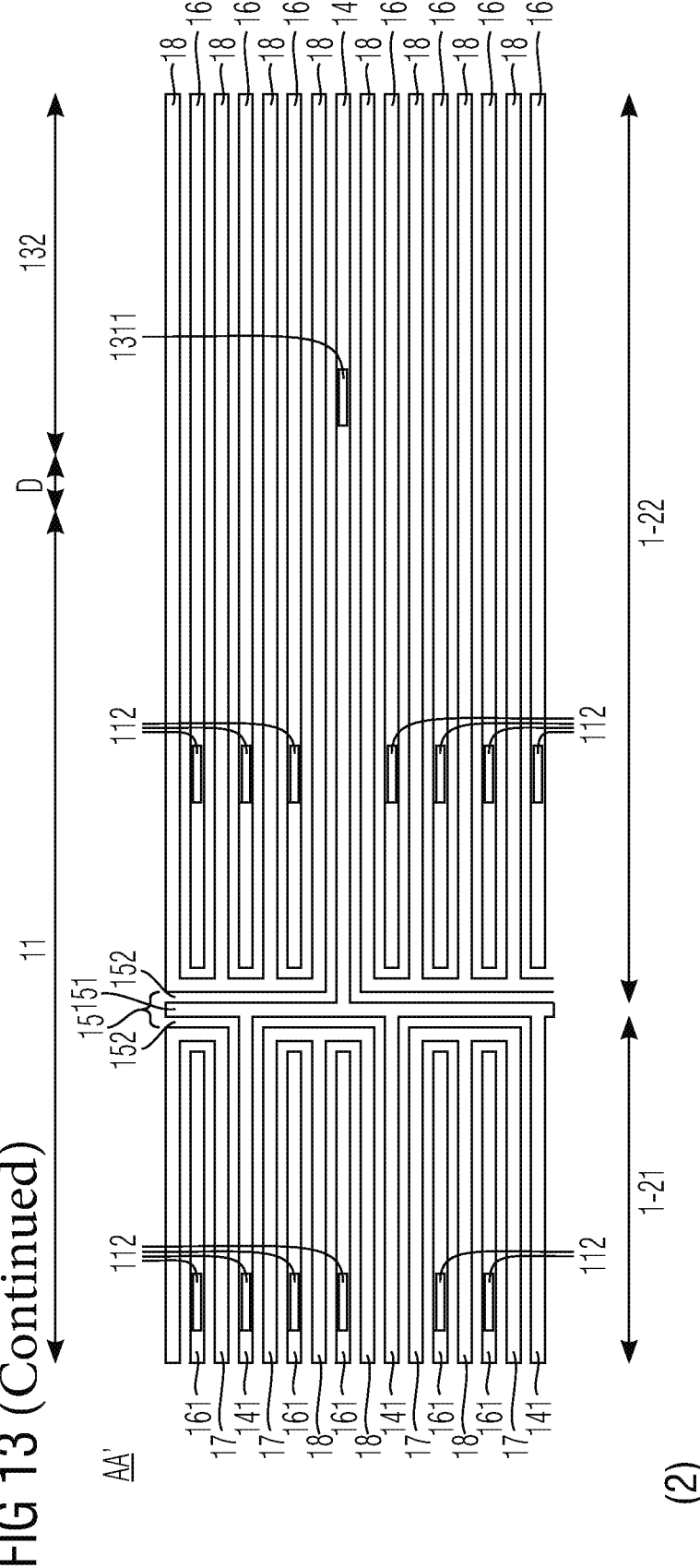

For example, looking at two variants (1) and (2) illustrated in FIG. 13, based on cross trench 15 between the diode section 1-22 and the IGBT section 1-21, it may be provided that only a subset or even only one control trench 14 extends into both the diode section 1-22 and the IGBT section 1-21. The control trench electrode 141 of this at least one control trench 14 may be electrically connected to the control terminal finger 132 as explained above, e.g., with respect to FIG. 6.

The cross trench 15 comprises a cross trench electrode 151 electrically connected to the control terminal 13, wherein said at least one control trench 14 extends (e.g., laterally) from the diode section 1-22 to adjoin the cross trench 15. The same control trench 14 (variant (1)) or another one (variant (2)) may then extend from the cross trench 15 into the IGBT section 1-21. For example, others of the plurality of control trenches 14 adjoin and terminate in the cross trench 15. The control trenches 14 are arranged perpendicular to the cross trench 15.

The control trench electrode 141 of said at least one control trench may be electrically connected to the cross trench electrode 151; said two trench electrodes 151 and 141 may be arranged so as to form an intersection. Alternatively, cf. variant (2), there may be no direct/"linear" continuation of the at least one control trench 14 extending from the diode section 1-22 within the IGBT section 1-21, i.e., also the at least one control trench 14 terminates at the cross trench 15 and the extension into the diode section 1-22 is established based on a laterally displaced version of the at least one control trench 14. As illustrated, the control trench electrodes 141 of the remaining control trenches 14 adjoin into the cross trench electrode 151 and terminate there. Of course, the source trench electrodes 161 do not adjoin into the cross trench 15, but terminate separate thereof. As the other trench electrodes, the cross trench electrode 151 is separated from the semiconductor body based on the cross trench insulator 152.

The cross trench 15 may be arranged so as to overlap with the first load terminal 11. For example, the area where the cross trench 15 is arranged may be regarded as a transition area between the diode section 1-22 and the IGBT section 1-21.

Figure 14:
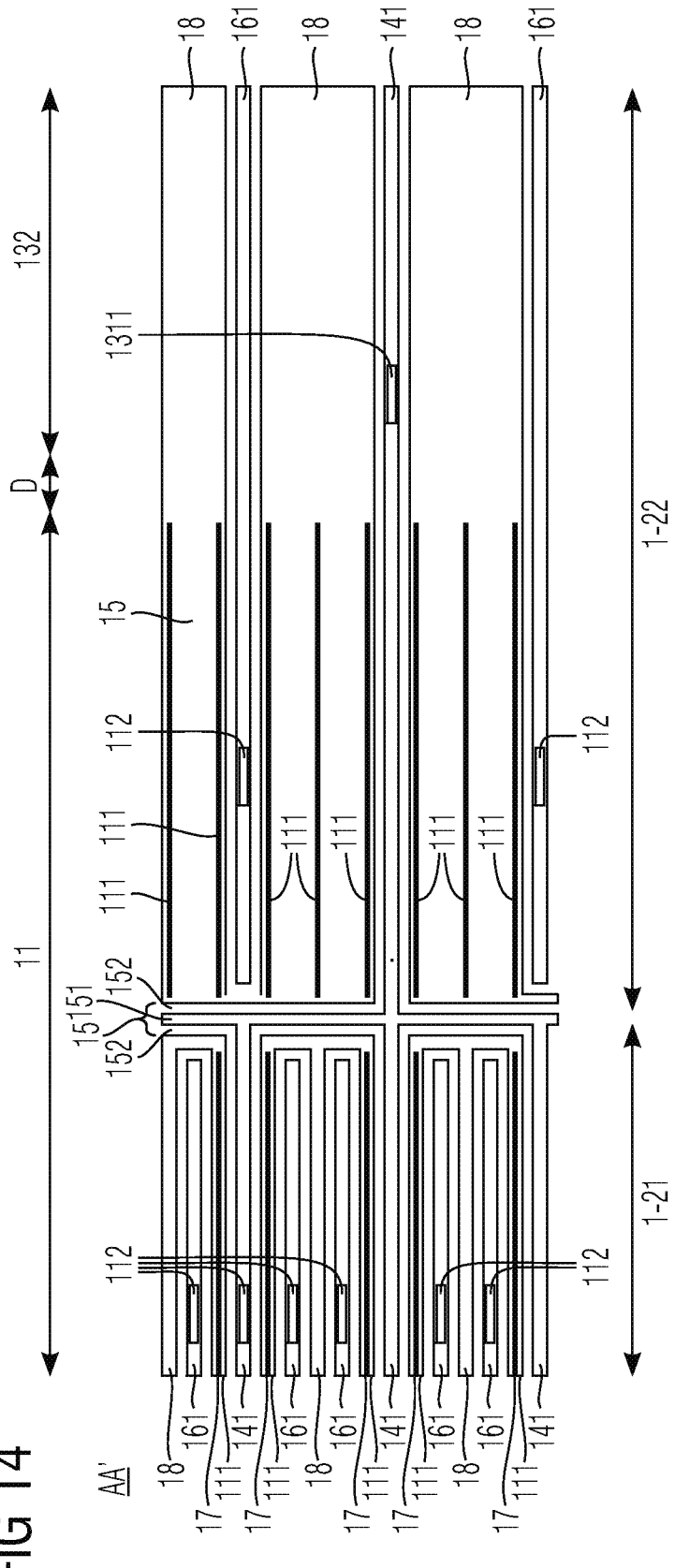

In FIG. 13, the trench-mesa-pattern in the diode section 1-22 may hence differ from the trench-mesa-pattern in the IGBT section 1-21. For example, besides said at least one control trench 14, the diode section only includes source trenches 16. Furthermore, as illustrated in FIG. 14, which also shows the first contact plugs 111 used for electrically connecting the first and second type mesas 17, 18, the entire trench density in the diode section 1-22 may be smaller as compared to the trench density in the IGBT section 1-21, e.g., yielding wider second type mesas in the diode section 1-22. There, the second type mesas 18 (or a portion thereof) are not electrically connected to first load terminal, thereby forming dummy mesas.

Figure 15:
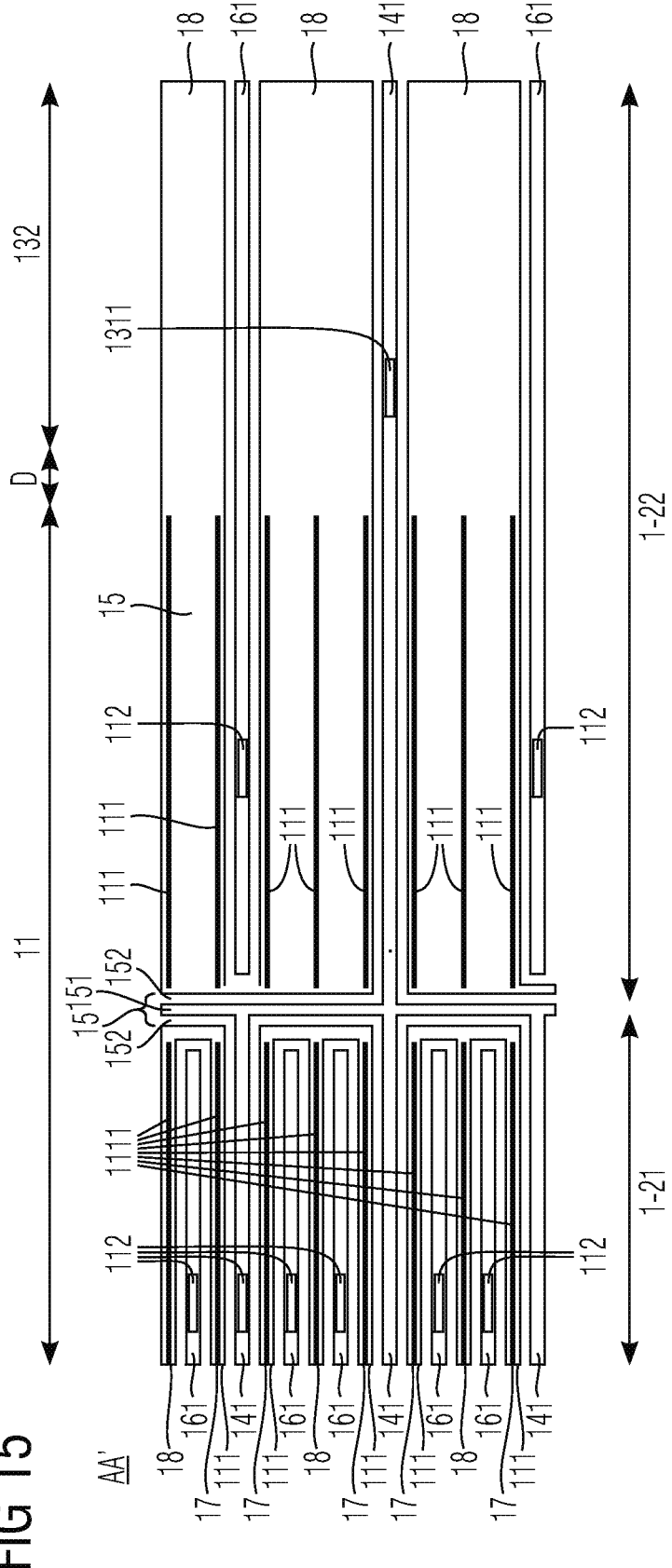

FIG. 15 schematically and exemplarily illustrates a yet further variant of the configuration illustrated in FIG. 4 in accordance with one or more embodiments. The design of the diode section 1-22 may be the same as illustrated in FIG. 14, but in the IGBT section 1-21, compared to the variant of FIG. 14, also the second type mesas 18 are electrically connected to the first load terminal 11 based on the first contact plugs 111. As described further above, those non-connected mesas shown in FIG. 14 are not used for load current conduction, neither for forward load current nor for reverse load current conduction, and can hence be considered as dummy mesas.

The variant illustrated in FIG. 16 mainly corresponds to the variant illustrated in FIG. 15, the difference being in a different contacting scheme of the second type mesas 18 in the diode section 1-22 (which may, as explained above, exhibit the same configuration as the first type mesas 17 in the diode section 1-22, i.e., have a diode configuration with the anode region 1061 (and, optionally, 1062)). There, instead of using the first contact plugs 111, wider contacts 117 are employed that take into account the greater mesa width in the diode section 1-22.

As illustrated in FIG. 17, these wider contacts 117 may not only be used to contact the second type mesas 18, but also as shared contacts to also contact the source trench electrodes 161 in the diode section 1-22. Similarly, in the IGBT section 1-21, said wide joint contacts 114 that have been described with respect to FIG. 9, variant (1), may be employed to electrically contact both the source trench electrodes 161 of two adjacent source trenches 16, as well as the second type mesa 18 in between thereto and the two first type mesas 17 adjacent thereto.

FIG. 18 schematically and exemplarily illustrates a section of a vertical cross-section of the RC IGBT 1 in accordance with one or more further embodiments. There, two control terminal fingers 132 extend into the diode section 1-22. The control terminal fingers 132 are separated from the portions of the first load terminal 11 in the diode section 1-22, e.g., at least by a respective distance D. Below the control terminal fingers 132, the diode section 1-22 may exhibit the second anode regions 1062 which may exhibit a greater dopant concentration as compared to the first anode regions 1061 electrically connected to the first load terminal 11 based on the first contact plugs 111, e.g., for the reasons explained above.

Presented herein is also a method of producing an RC IGBT. The method of producing an RC IGBT comprises forming the following the components: an active region with an IGBT section and, separate from the IGBT section, a diode section; a semiconductor body forming a part of the active region and having a first side and a second side; a first load terminal at the first side and a second load terminal at the second side; a control terminal at the first side, wherein the control terminal is electrically insulated from the semiconductor body and comprises a control terminal finger that laterally overlaps, in the active region, with the diode section. The RC IGBT production method further comprises forming a plurality of control trenches extending into the semiconductor body along a vertical direction. Each control trench has a control trench electrode electrically connected to the control terminal and configured to control a load current between the first load terminal and the second load terminal in the IGBT section. At least one of the plurality of control trenches extends into both the IGBT section and the diode section. The electrical connection between the control trench electrode of said at least one control trench and the control terminal is established at least based on an electrically conductive member arranged, in the diode section, in contact with the control terminal finger.

Embodiments of the RC IGBT production method correspond to the embodiments of the RC IGBT 1 presented above.

In the above, embodiments pertaining to an RC IGBT and corresponding production methods were explained. For example, these RC IGBTs are based on silicon (Si). Accordingly, a monocrystalline semiconductor region or layer, e.g., the semiconductor body 10 and its regions/zones, e.g., regions etc. can be a monocrystalline Si-region or Si-layer. In other embodiments, polycrystalline or amorphous silicon may be employed. For example, the above described values of the dopant concentrations and dopant doses are related to embodiments where Si is chosen as the material of the semiconductor body 10.

It should, however, be understood that the semiconductor body 10 and its regions/zones can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), aluminum gallium nitride (AlGaN) and aluminum indium nitride (AlInN). For power semiconductor switches applications currently mainly Si, SiC, GaAs and GaN materials are used.

For example, for embodiments where SiC is chosen as the material of the semiconductor body 10, the above described values of the dopant concentrations and dopant doses may need to be adapted. For example, in case of SiC, the dopant concentrations are increased by a factor of ten or a factor of 100, and the dopant doses are increased by a factor between three and ten, compared to the values of the doses and concentrations described above.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A reverse conducting insulated gate bipolar transistor (RC IGBT), comprising:

an active region with an IGBT section and, separate from the IGBT section, a diode section;

a semiconductor body forming a part of the active region and having a first side and a second side;

a first load terminal at the first side and a second load terminal at the second side;

a control terminal at the first side, wherein the control terminal is electrically insulated from the semiconductor body and comprises a control terminal finger that laterally overlaps, in the active region, with the diode section; and a plurality of control trenches extending into the semiconductor body along a vertical direction, wherein each control trench has a control trench electrode electrically connected to the control terminal and configured to control a load current between the first load terminal and the second load terminal in the IGBT section, wherein at least one of the plurality of control trenches extends into both the IGBT section and the diode section, wherein the electrical connection between the control trench electrode of the at least one control trench and the control terminal is established at least based on an electrically conductive member arranged, in the diode section, in contact with the control terminal finger.

2. The RC IGBT of claim 1, wherein:

the control trench electrode of the at least one control trench laterally overlaps, in the diode section, with the control terminal finger; and the electrically conductive member is formed as a control contact plug extending, along the vertical direction, from the control terminal finger to the portion of the control trench electrode that laterally overlaps with the control terminal finger.

3. The RC IGBT of claim 1, wherein:
the control trench electrode of the at least one control trench does not laterally overlap, in the diode section, with the control terminal finger; and
the electrically conductive member extends laterally from the control terminal finger towards the IGBT section and above an insulation layer at the first side.

4. The RC IGBT of claim 1, wherein the at least one control trench extends laterally from a first portion of the IGBT section to cross the diode section and extends into another portion of the IGBT section, both of the portions of the IGBT section being arranged adjacent to the diode section.

5. The RC IGBT of claim 1, further comprising a plurality of first contact plugs electrically connected to the first load terminal and configured to contact the semiconductor body in both the diode section and the IGBT section, wherein the IGBT section comprises a body region electrically connected to the first load terminal based on at least one of the first contact plugs, and wherein the diode section comprises an anode region electrically connected to the first load terminal based on at least one of the first contact plugs.

6. The RC IGBT of claim 5, wherein:
the anode region comprises a first portion laterally overlapping with the first load terminal and, in contact therewith, a second portion laterally overlapping with control terminal finger;
the control terminal finger in the diode section is separated from the semiconductor body at least based on an insulation layer at the first side.

7. The RC IGBT of claim 6, wherein a dopant dose of the second portion is at least 10 times as high as compared to the dopant dose of the first portion of the anode region.

8. The RC IGBT of claim 6, wherein the second portion of the anode region is laterally displaced from the first load terminal or, respectively, from an adjacent one of the first contact plugs by at least 500 nm.

9. The RC IGBT of claim 5, wherein the body region and the anode region are of the same conductivity type and form a contiguous semiconductor region.

10. The RC IGBT of claim 1, further comprising a plurality of first type mesas as part of the semiconductor body, wherein each first type mesa is electrically connected to the first load terminal, and wherein at least one first type mesa has a diode portion with a diode configuration in the diode section and an IGBT portion with an IGBT configuration in the IGBT section.

11. The RC IGBT of claim 1, further comprising a plurality of source trenches extending into the semiconductor body along the vertical direction, wherein each source trench has a source trench electrode electrically connected to the first load terminal and extends at least into one of the IGBT section and the diode section.

12. The RC IGBT of claim 11, wherein the plurality of control trenches and the plurality of source trenches exhibit a respective stripe configuration and are arranged laterally adjacent to each other in accordance with a trench-mesa-pattern.

13. The RC IGBT of claim 11, further comprising a plurality of second type mesas as part of the semiconductor body, wherein each second type mesa is laterally confined by respective two of the source trenches.

14. The RC IGBT claim 11, further comprising a plurality of second contact plugs electrically connected to the first load terminal and configured to contact the source trench electrodes.

15. The RC IGBT of claim 1, further comprising at least one cross trench, wherein the at least one cross trench comprises a cross trench electrode electrically connected to the control terminal, wherein the at least one control trench extends from the diode section to adjoin the at least one cross trench, and wherein others of the plurality of control trenches adjoin and terminate in the at least one cross trench.

16. The RC IGBT of claim 15, wherein the plurality of control trenches are arranged perpendicular to the at least one cross trench.

17. The RC IGBT of claim 15, further comprising a plurality of source trenches extending into the semiconductor body along the vertical direction, wherein each source trench has a source trench electrode electrically connected to the first load terminal and extends at least into one of the IGBT section and the diode section, wherein the plurality of control trenches and the plurality of source trenches exhibit a respective stripe configuration and are arranged laterally adjacent to each other in accordance with a trench-mesa-pattern, and wherein the trench-mesa-pattern in the IGBT section is different compared to the trench-mesa-pattern in the diode section.

18. The RC IGBT of claim 1, wherein the control terminal further comprises a control terminal runner arranged in an edge portion of the active region, and wherein the control terminal finger extends towards a central portion of the active region and does not laterally overlap with the IGBT section.

19. The RC IGBT of claim 1, wherein at least 80% of a lateral circumference of the diode section is surrounded by the IGBT section.

20. A method of producing a reverse conducting insulated gate bipolar transistor (RC IGBT), the method comprising:
forming an active region with an IGBT section and, separate from the IGBT section, a diode section;
forming a semiconductor body that forms a part of the active region and has a first side and a second side;
forming a first load terminal at the first side and a second load terminal at the second side;
forming a control terminal at the first side, wherein the control terminal is electrically insulated from the semiconductor body and comprises a control terminal finger that laterally overlaps, in the active region, with the diode section; and
forming a plurality of control trenches that extend into the semiconductor body along a vertical direction, wherein each control trench has a control trench electrode electrically connected to the control terminal and configured to control a load current between the first load terminal and the second load terminal in the IGBT section, wherein at least one of the plurality of control trenches extends into both the IGBT section and the diode section, wherein the electrical connection between the control trench electrode of the at least one control trench and the control terminal is established at least based on an electrically conductive member arranged, in the diode section, in contact with the control terminal finger.

\* \* \* \* \*